United States Patent
Chen et al.

(10) Patent No.: US 11,502,062 B2
(45) Date of Patent: Nov. 15, 2022

(54) INTEGRATED CIRCUIT PACKAGE AND METHOD

(71) Applicant: Taiwan Semiconductor Manufacturing Co., Ltd., Hsinchu (TW)

(72) Inventors: Ming-Fa Chen, Taichung (TW); Tzuan-Horng Liu, Longtan Township (TW); Chao-Wen Shih, Zhubei (TW); Sung-Feng Yeh, Taipei (TW); Nien-Fang Wu, Chiayi (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/334,025

(22) Filed: May 28, 2021

(65) Prior Publication Data

US 2021/0288030 A1    Sep. 16, 2021

Related U.S. Application Data

(62) Division of application No. 16/559,253, filed on Sep. 3, 2019, now Pat. No. 11,024,605.

(Continued)

(51) Int. Cl.
*H01L 25/065* (2006.01)
*H01L 23/31* (2006.01)
(Continued)

(52) U.S. Cl.
CPC .... *H01L 25/0657* (2013.01); *H01L 21/31053* (2013.01); *H01L 21/56* (2013.01);
(Continued)

(58) Field of Classification Search
CPC ............ H01L 25/0657; H01L 23/3135; H01L 23/481; H01L 24/32; H01L 23/544; H01L 21/51053; H01L 21/56; H01L 23/5226
(Continued)

(56) References Cited

U.S. PATENT DOCUMENTS 9,000,584 B2   4/2015  Lin et al.
9,048,222 B2   6/2015  Hung et al.
(Continued)

FOREIGN PATENT DOCUMENTS

CN    102931102 A    2/2013
CN    103633075 A    3/2014
(Continued)

*Primary Examiner* — Thinh T Nguyen
(74) *Attorney, Agent, or Firm* — Slater Matsil, LLP

(57) ABSTRACT

In an embodiment, a device includes: a bottom integrated circuit die having a first front side and a first back side; a top integrated circuit die having a second front side and a second back side, the second back side being bonded to the first front side, the top integrated circuit die being free from through substrate vias (TSVs); a dielectric layer surrounding the top integrated circuit die, the dielectric layer being disposed on the first front side, the dielectric layer and the bottom integrated circuit die being laterally coterminous; and a through via extending through the dielectric layer, the through via being electrically coupled to the bottom integrated circuit die, surfaces of the through via, the dielectric layer, and the top integrated circuit die being planar.

20 Claims, 31 Drawing Sheets

Related U.S. Application Data

(60) Provisional application No. 62/855,101, filed on May 31, 2019.

(51) Int. Cl.
| | |
|---|---|
| *H01L 21/56* | (2006.01) |
| *H01L 23/522* | (2006.01) |
| *H01L 23/00* | (2006.01) |
| *H01L 23/544* | (2006.01) |
| *H01L 23/528* | (2006.01) |
| *H01L 25/00* | (2006.01) |
| *H01L 21/3105* | (2006.01) |
| *H01L 21/768* | (2006.01) |
| *H01L 21/78* | (2006.01) |
| *H01L 21/683* | (2006.01) |
| *H01L 23/48* | (2006.01) |
| *H01L 21/66* | (2006.01) |

(52) U.S. Cl.
CPC .... *H01L 21/6836* (2013.01); *H01L 21/76877* (2013.01); *H01L 21/78* (2013.01); *H01L 23/3135* (2013.01); *H01L 23/481* (2013.01); *H01L 23/528* (2013.01); *H01L 23/5226* (2013.01); *H01L 23/544* (2013.01); *H01L 24/05* (2013.01); *H01L 24/19* (2013.01); *H01L 24/20* (2013.01); *H01L 24/27* (2013.01); *H01L 24/32* (2013.01); *H01L 24/73* (2013.01); *H01L 24/83* (2013.01); *H01L 24/92* (2013.01); *H01L 24/94* (2013.01); *H01L 25/50* (2013.01); *H01L 22/32* (2013.01); *H01L 24/29* (2013.01); *H01L 2221/68327* (2013.01); *H01L 2223/54426* (2013.01); *H01L 2224/27616* (2013.01); *H01L 2224/29187* (2013.01); *H01L 2224/32145* (2013.01); *H01L 2224/73267* (2013.01); *H01L 2224/8313* (2013.01); *H01L 2224/83896* (2013.01); *H01L 2224/92244* (2013.01); *H01L 2225/06541* (2013.01); *H01L 2225/06548* (2013.01); *H01L 2225/06568* (2013.01); *H01L 2225/06586* (2013.01)

(58) Field of Classification Search
USPC .......................... 257/774.773; 438/627, 629
See application file for complete search history.

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,373,605 B1 | 6/2016 | Wang et al. |
| 9,449,914 B2 | 9/2016 | Ho et al. |
| 9,496,189 B2 | 11/2016 | Yu et al. |
| 9,773,757 B2 | 9/2017 | Yu et al. |
| 2010/0178731 A1 | 7/2010 | Mihara |
| 2013/0040423 A1 | 2/2013 | Tung et al. |
| 2014/0054760 A1 | 2/2014 | Yu et al. |
| 2015/0130070 A1 | 5/2015 | Lin et al. |
| 2015/0262928 A1* | 9/2015 | Shen et al. ............ H01L 23/315 257/686 |
| 2017/0005074 A1 | 1/2017 | Chen et al. |
| 2018/0082964 A1 | 3/2018 | Wu et al. |
| 2018/0122780 A1 | 5/2018 | Chen et al. |
| 2019/0027465 A1 | 1/2019 | Yeh et al. |
| 2019/0131241 A1 | 5/2019 | Jeng et al. |
| 2019/0148342 A1 | 5/2019 | Hu et al. |

FOREIGN PATENT DOCUMENTS

| | | |
|---|---|---|
| CN | 107622982 A | 1/2018 |
| DE | 102014111783 A1 | 1/2016 |
| JP | 2018037687 A | 3/2018 |
| KR | 20170003352 A | 1/2017 |
| KR | 20180032516 A | 3/2018 |
| KR | 20190055770 A | 5/2019 |
| TW | 201705314 A | 2/2017 |
| TW | 201737432 A | 10/2017 |
| TW | 201901817 A | 1/2019 |
| TW | 201919134 A | 5/2019 |

* cited by examiner

INTEGRATED CIRCUIT PACKAGE AND METHOD

PRIORITY CLAIM AND CROSS-REFERENCE

This application is a division of U.S. patent application Ser. No. 16/559,253, filed on Sep. 3, 2019, entitled "Integrated Circuit Package and Method," which claims the benefit of and priority to U.S. Provisional Patent Application No. 62/855,101, filed on May 31, 2019, entitled "Integrated Circuit Package and Method," which are incorporated herein by reference.

BACKGROUND

Since the development of the integrated circuit (IC), the semiconductor industry has experienced continued rapid growth due to continuous improvements in the integration density of various electronic components (i.e., transistors, diodes, resistors, capacitors, etc.). For the most part, these improvements in integration density have come from repeated reductions in minimum feature size, which allows more components to be integrated into a given area. These integration improvements are essentially two-dimensional (2D) in nature, in that the area occupied by the integrated components is essentially on the surface of the semiconductor wafer.

The increased density and corresponding decrease in area of the integrated circuit has generally surpassed the ability to bond an integrated circuit die directly onto a substrate. As the demand for shrinking electronic devices has grown, a need for smaller and more creative packaging techniques of semiconductor dies has emerged. Packages incorporating three-dimensional (3D) aspects have enabled the production of semiconductor devices with enhanced functionalities and small footprints.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
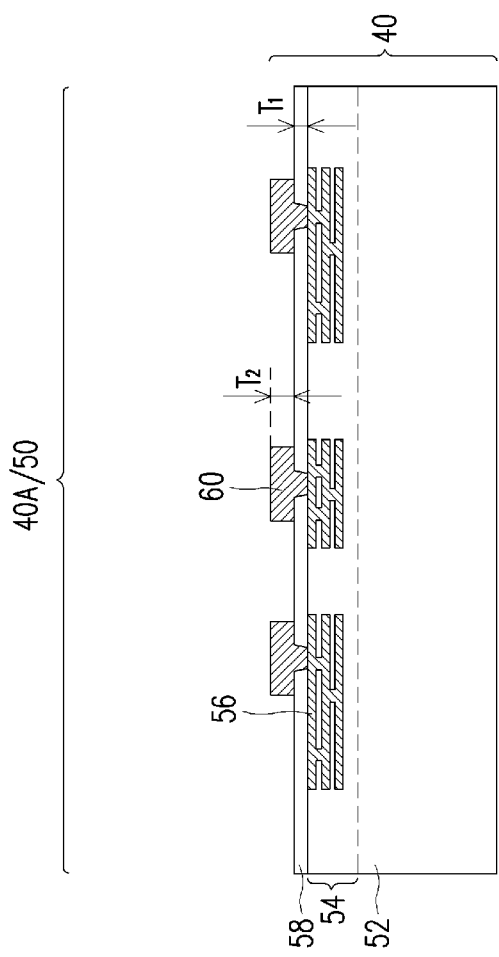
FIGS. 1 through 7 are cross-sectional views of intermediate steps during processing of a wafer to form integrated circuit dies, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a die stack is formed by stacking integrated circuit dies in a back-to-face manner, without the use of solder. The die stack may include a top integrated circuit die and a bottom integrated circuit die bonded together. The integrated circuit dies may be directly bonded by, e.g., fusion bonding. The die stack is subsequently packaged in an integrated circuit package that comprises a redistribution structure. The metallization patterns of the redistribution structure may have fine pitches, such as pitches in the range of about 0.8 μm to about 5 μm. The redistribution structure may thus be used to both interconnect the integrated circuit dies of the die stack, and also fan-out electrical connections for the die stack. As such, the integrated circuit dies can be electrically interconnected without forming through substrate vias (TSVs) in the integrated circuit dies, and without packaging interposers in the integrated circuit package. Manufacturing costs of the integrated circuit dies and integrated circuit package may thus be reduced.

FIGS. 1 through 7 are cross-sectional views of intermediate steps during processing of a wafer 40 to form integrated circuit dies 50, in accordance with some embodiments. The integrated circuit dies 50 will be singulated from the wafer 40 and stacked in subsequent processing to form die stacks. One integrated circuit die 50 is shown for illustrative purposes, but it is understood that the wafer 40 may have multiple integrated circuit dies 50. Each integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

In FIG. 1, a semiconductor substrate 52 is provided. The semiconductor substrate 52 may be silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side. Devices are formed at the active surface of the semiconductor substrate. The devices may be active devices (e.g., transistors, diodes, etc.) or passive devices (e.g., capacitors, resistors, inductors, etc.).

The wafer 40 has multiple device regions, and an integrated circuit die 50 is formed in and/or on each of the device regions. A first device region 40A is illustrated, but it should be appreciated that the wafer 40 may have any number of device regions. The device regions will be singulated after processing to form the integrated circuit dies 50.

An interconnect structure 54 is formed over the semiconductor substrate 52. The interconnect structure 54 interconnects the devices of the semiconductor substrate 52 to form integrated circuits in each of the device regions. The interconnect structure 54 may be formed of, for example, metallization patterns in dielectric layers. The metallization patterns include metal lines and vias formed in one or more low-k dielectric layers. The interconnect structure 54 may be formed by a damascene process, such as a single damascene process, a dual damascene process, or the like. The metallization patterns of the interconnect structure 54 are electrically coupled to the devices of the semiconductor substrate 52.

Contact pads 56 are formed at the front side of the integrated circuit die 50, such as in the interconnect structure 54. The contact pads 56 may be aluminum pads, copper pads, or the like, to which external connections are made. In some embodiments, the contact pads 56 are part of the topmost metallization pattern of the interconnect structure 54.

One or more passivation layer(s) 58 are formed on the contact pads 56 and interconnect structure 54. The passivation layer(s) 58 may be formed of one or more suitable dielectric materials such as silicon oxide, silicon nitride, low-k dielectrics such as carbon doped oxides, extremely low-k dielectrics such as porous carbon doped silicon dioxide, a polymer such as polyimide, solder resist, polybenzoxazole (PBO), benzocyclobutene (BCB), molding compound, the like, or a combination thereof. The passivation layer(s) 58 may be formed by spin coating, lamination, chemical vapor deposition (CVD), the like, or a combination thereof. The passivation layer(s) 58 are formed to a combined thickness $T_1$, such as a thickness $T_1$ in the range of about 1 kÅ to about 10 kÅ. In some embodiments, the passivation layer(s) 58 include a silicon nitride layer and a silicon oxide layer on the silicon nitride layer, where the silicon nitride layer may be formed to a thickness in the range of about 100 Å to about 750 Å, and the silicon oxide layer may be formed to a thickness in the range of about 1 kÅ to about 10 kÅ.

Testing pads 60 are formed extending through the passivation layer(s) 58 to physically and electrically couple to the contact pads 56. The testing pads 60 are used for device testing, and are not electrically coupled or active during normal operation of the integrated circuit dies 50. In some embodiments, the testing pads 60 are formed of a lower-cost conductive material (e.g., aluminum) than the contact pads 56 or the metallization pattern(s) of the interconnect structure 54. The testing pads 60 may be formed by a damascene process, such as a single damascene process. The testing pads 60 are formed to a thickness $T_2$, such as a thickness $T_2$ in the range of about 2 kÅ to about 40 kÅ.

Circuit probe (CP) testing is then performed on the integrated circuit dies 50 to ascertain whether the integrated circuit dies 50 are known good dies (KGDs). The integrated circuit dies 50 are tested by use of a probe. The probe is physically and electrically coupled to the testing pads 60 by, e.g., test connectors. Only integrated circuit dies 50 which are KGDs undergo subsequent processing and packaging, and integrated circuit dies 50 which fail the CP testing are not packaged. The testing may include testing of the functionality of the various integrated circuit dies 50, or may include testing for known open or short circuits that may be expected based on the design of the integrated circuit dies 50. After testing is complete, the probe is removed and any excess reflowable material on the testing pads 60 may be removed by, e.g., an etching process, a chemical-mechanical polish (CMP), a grinding process, or the like.

Figure 2:
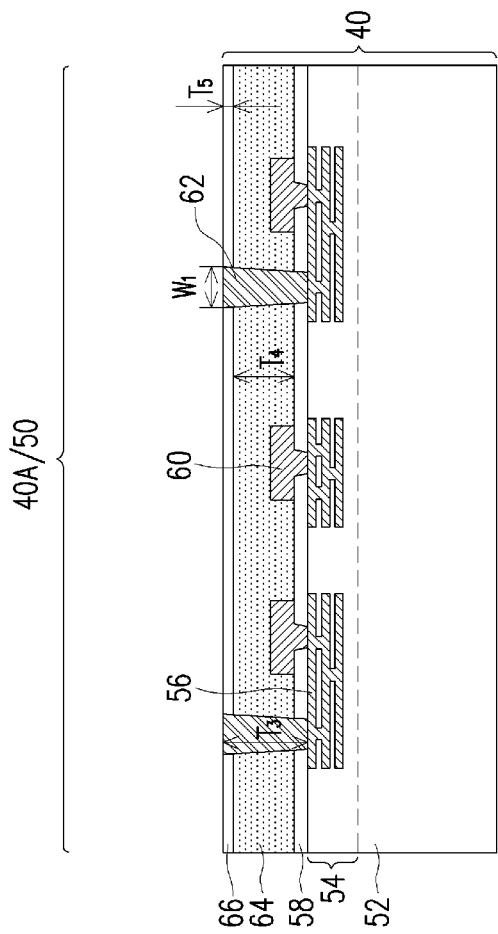

In FIG. 2, die connectors 62 are optionally formed on respective ones of the contact pads 56. The die connectors 62 may be through vias or conductive pillars, and may be formed of a metal such as copper. The die connectors 62 are physically and electrically coupled to respective ones of the contact pads 56, and are electrically coupled to the respective integrated circuits of the integrated circuit dies 50. As an example to form the die connectors 62, openings may be formed in the passivation layer(s) 58, and a seed layer may be formed along the passivation layer(s) 58 and in the openings through the passivation layer(s) 58. The openings may be formed by acceptable photolithography and etching techniques. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to the die connectors 62. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, such as copper, titanium, tungsten, aluminum, or the like. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the die connectors 62. The die connectors 62 are formed to a width $W_1$ and a thickness $T_3$, such as a width $W_1$ in the range of about 1 µm to about 5 µm, and a thickness $T_3$ in the range of about 0.5 µm to about 5 µm. Further, the die connectors 62 may be formed to a small pitch, such as a pitch in the range of about 2 µm to about 20 µm.

A dielectric layer 64 is formed on the front side of the integrated circuit die 50, such as on the passivation layer(s) 58 and the testing pads 60. The dielectric layer 64 laterally surrounds the die connectors 62 (when formed) and testing pads 60, and buries the testing pads 60 such that the testing pads 60 remain electrically isolated in the resulting integrated circuit dies 50. The dielectric layer 64 may be a polymer such as PBO, polyimide, BCB, or the like; a nitride such as silicon nitride or the like; an oxide such as silicon oxide, phosphosilicate glass (PSG), borosilicate glass (BSG), boron-doped phosphosilicate glass (BPSG), or the like; tetraethyl orthosilicate (TEOS); the like; or a combination thereof. The dielectric layer 64 may be formed, for example, by spin coating, lamination, CVD, or the like. In some embodiments, the dielectric layer 64 is a layer of TEOS. After initial formation, the dielectric layer 64 is planarized, which exposes the die connectors 62 (when formed) but does not expose the testing pads 60. The planarization may be performed by an etching process, a chemical-mechanical polish (CMP), a grinding process, or the like. An etch-back may be performed to expose sidewalls of the die connectors 62. The resulting dielectric layer 64 has a thickness $T_4$, such as a thickness $T_4$ in the range of about 0.5 µm to about 2.5 µm.

As discussed further below, multiple integrated circuit dies 50 will be stacked in subsequent processing to form die stacks. The integrated circuit dies 50 are bonded together in a back-to-face manner, e.g., where the back side of the top integrated circuit die is bonded to the front side of the bottom integrated circuit die. The bonding is performed without the use of solder, and may be by several methods. In some embodiments, direct bonding may be used to form dielectric-to-dielectric bonds or dielectric-to-semiconductor bonds. In some embodiments, the dies are bonded with an adhesive such as any suitable adhesive, epoxy, die attach film (DAF), or the like.

In embodiments where integrated circuit dies 50 are stacked by direct bonding, one or more bonding layer(s) 66 can be formed on the dielectric layer 64 and around the die connectors 62, e.g., on the exposed sidewalls of the die connectors 62. The bonding layer(s) 66 may be formed of one or more suitable dielectric materials such as silicon oxide, silicon nitride, a polymer, the like, or a combination thereof. The bonding layer(s) 66 may be formed by spin coating, lamination, or a deposition process such as CVD, high density plasma CVD (HDPCVD) the like, or a combination thereof. After initial formation, the bonding layer(s) 66 are planarized, which exposes the die connectors 62 (when formed) but does not expose the testing pads 60. The planarization may be performed by an etching process, a chemical-mechanical polish (CMP), a grinding process, or the like. After planarization, the bonding layer(s) 66 have a combined thickness $T_5$, such as a thickness $T_5$ in the range of about 1 kÅ to about 10 kÅ. The bonding layer(s) 66 are formed of a nitrogen-doped oxide, such as nitrogen-doped silicon oxide (e.g., silicon oxynitride), which may help increase the strength of bonds that will be formed with the bonding layer(s) 66. In some embodiments, the bonding layer(s) 66 include a silicon nitride layer and a silicon oxynitride layer on the silicon nitride layer, where the silicon nitride layer may be formed to a thickness in the range of about 100 Å to about 750 Å, and the silicon oxynitride layer may be formed to a thickness in the range of about 1 kÅ to about 10 kÅ.

Figure 3:
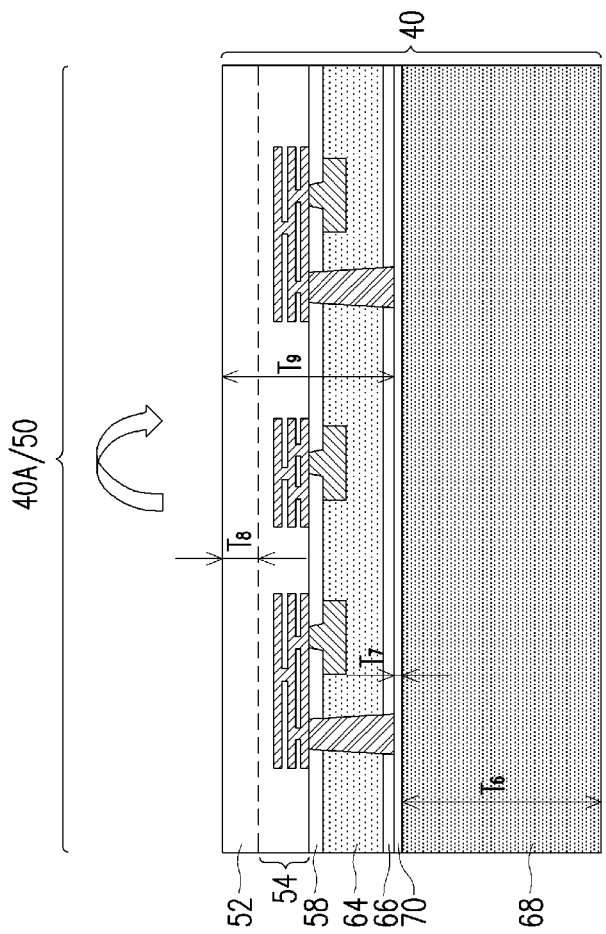

In FIG. 3, the wafer 40 is flipped and a carrier substrate 68 is bonded to the dielectric layer 64. The carrier substrate 68 may be silicon, doped or undoped, or may include other semiconductor materials, such as germanium; a compound semiconductor; or combinations thereof. The carrier substrate 68 can have a large thickness $T_6$, such as a thickness $T_6$ in the range of about 100 µm to about 775 µm.

In some embodiments, the carrier substrate 68 is bonded to the dielectric layer 64 by fusion bonding. One or more bonding layer(s) 70 may be formed on the carrier substrate 68. The bonding layer(s) 70 may be formed of one or more suitable dielectric materials such as silicon oxide, silicon nitride, a polymer, the like, or a combination thereof. The bonding layer(s) 70 may be formed by spin coating, lamination, or a deposition process such as CVD, high density plasma CVD (HDPCVD) the like, or a combination thereof. The bonding layer(s) 70 are formed of a nitrogen-doped oxide, such as silicon oxynitride, which may help increase the strength of bonds that will be formed with the bonding layer(s) 70. After formation, the bonding layer(s) 70 have a combined thickness $T_7$, such as a thickness $T_7$ in the range of about 1 kÅ to about 5 kÅ. The bonding layers 66 and 70 are then pressed together to form dielectric-to-dielectric bonds that directly bond the integrated circuit die 50 to the carrier substrate 68. The presence of the nitrogen in the bonding layers 66 and/or 70 increases the strength of the bonds. An annealing process may be performed to further strengthen the bonds.

After the bonding, the semiconductor substrate 52 is thinned. Thinning may be accomplished by an etching process, a chemical-mechanical polish (CMP), a grinding process, or the like. Thinning the semiconductor substrate 52 allows the interconnect structure 54 to be optically positioned during a subsequent process for forming alignment marks in the semiconductor substrate 52. The semiconductor substrate 52 is thinned until the semiconductor substrate 52 has a thickness $T_8$, which can be small, such as in the range of about 5 µm to about 10 µm. After thinning, the semiconductor substrate 52, interconnect structure 54, passivation layer(s) 58, dielectric layer 64, and bonding layer(s) 66 have a combined thickness $T_9$, which can also be small, such as in the range of about 10 µm to about 20 µm.

Figure 4:
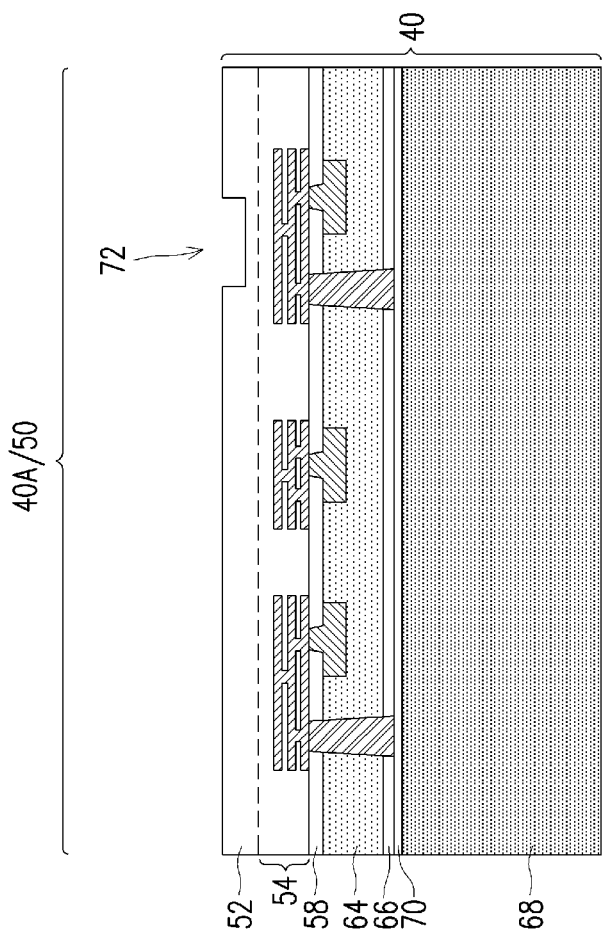

In FIG. 4, one or more recess(es) 72 are formed in the back side of the semiconductor substrate 52. The recess(es) 72 may be formed by acceptable photolithography and etching techniques, such as by using a patterned photoresist as an etching mask. The recess(es) 72 are for forming alignment marks, and are formed to a predetermined depth and width. For example, the recess(es) 72 can have a depth in the range of about 0.1 µm to about 1 µm and a width in the range of about 20 µm to about 100 µm. The recess(es) 72 can have regular and symmetric shapes in a plan view. The locations for the recess(es) 72 can be determined by sensing the pattern of the interconnect structure 54 using an optical scanner, such as an infrared scanner.

Figure 5:
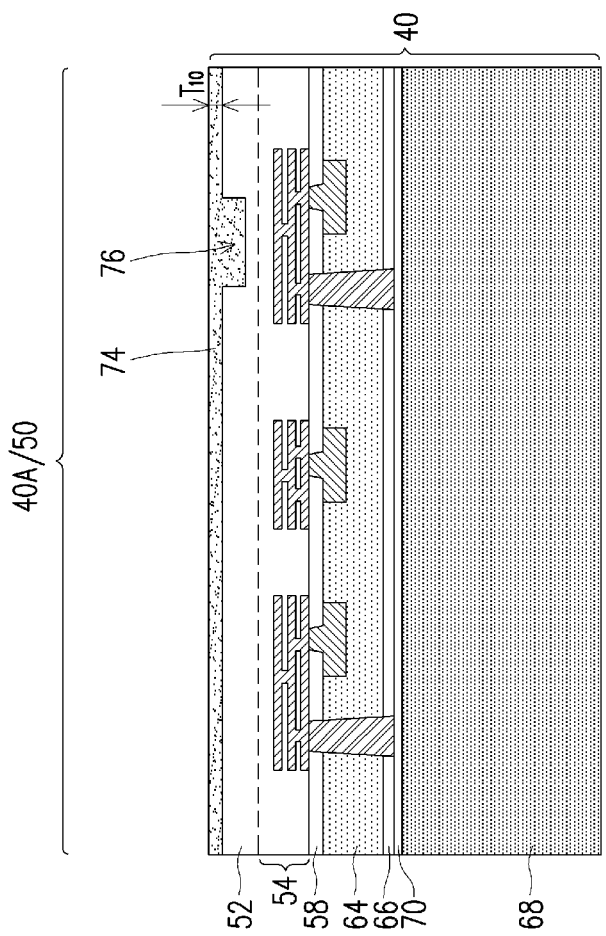

In FIG. 5, a bonding layer 74 may be formed on the back side of the semiconductor substrate 52 and in the recess(es) 72. The bonding layer 74 fills the recess(es) 72 to form alignment marks 76 that can be used for subsequent processing, and also will be used for bonding to form die stacks. The bonding layer 74 and alignment marks 76 may be formed of one or more suitable dielectric materials such as silicon oxide, silicon nitride, a polymer, the like, or a combination thereof. The bonding layer 74 may be formed by spin coating, lamination, or a deposition process such as CVD, high density plasma CVD (HDPCVD) the like, or a combination thereof. The bonding layer 74 is formed of a nitride, which may help increase the strength of bonds that will be formed with the bonding layer 74. In some embodiments, the bonding layer 74 is a silicon nitride layer. After formation, the bonding layer 74 is planarized. The planarization may be performed by an etching process, a chemical-mechanical polish (CMP), a grinding process, or the like. After planarization, the bonding layer 74 has a thickness $T_{10}$, which can be in the range of about 0.2 µm to about 2 µm.

Figure 6:
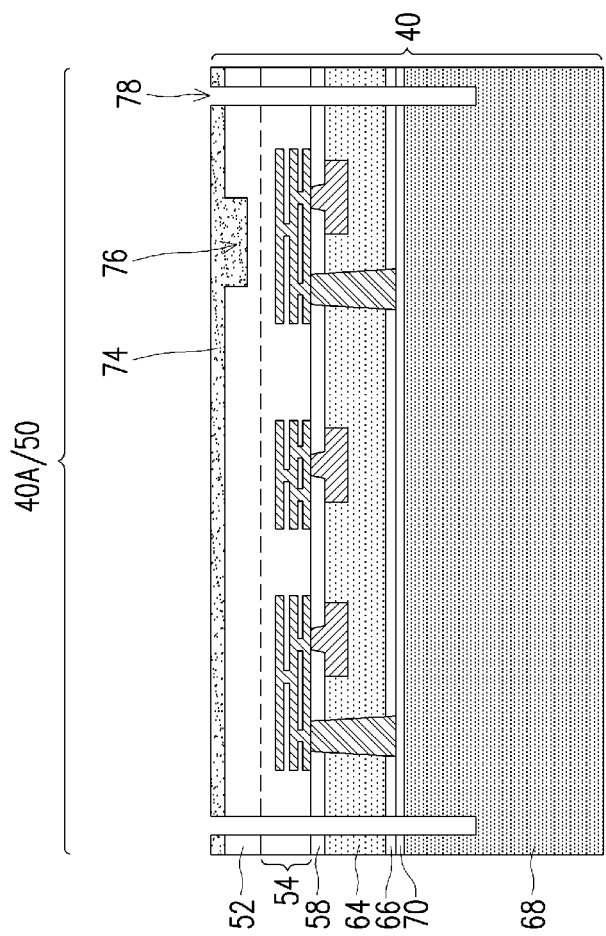

In FIG. 6, dicing streets 78 are formed in the wafer 40, e.g., in the semiconductor substrate 52, interconnect structure 54, dielectric layer 64, and bonding layers 66 and 70. The dicing streets 78 also extend partially into the carrier substrate 68. The dicing streets 78 are formed by acceptable photolithography and etching techniques, such as by using a patterned photoresist as an etching mask for a dry etching process. The alignment marks 76 are used to align the patterning of the etching mask when forming the dicing streets 78. Forming the dicing streets 78 by a dry etching process helps reduce the amount of damage caused to singulated integrated circuit dies 50. Each device region, such as the first device region 40A, is separated by the dicing streets 78. After the dry etching process, the semiconductor substrate 52 is singulated, but still remains bonded to portions of the carrier substrate 68 which are unsingulated.

Figure 7:
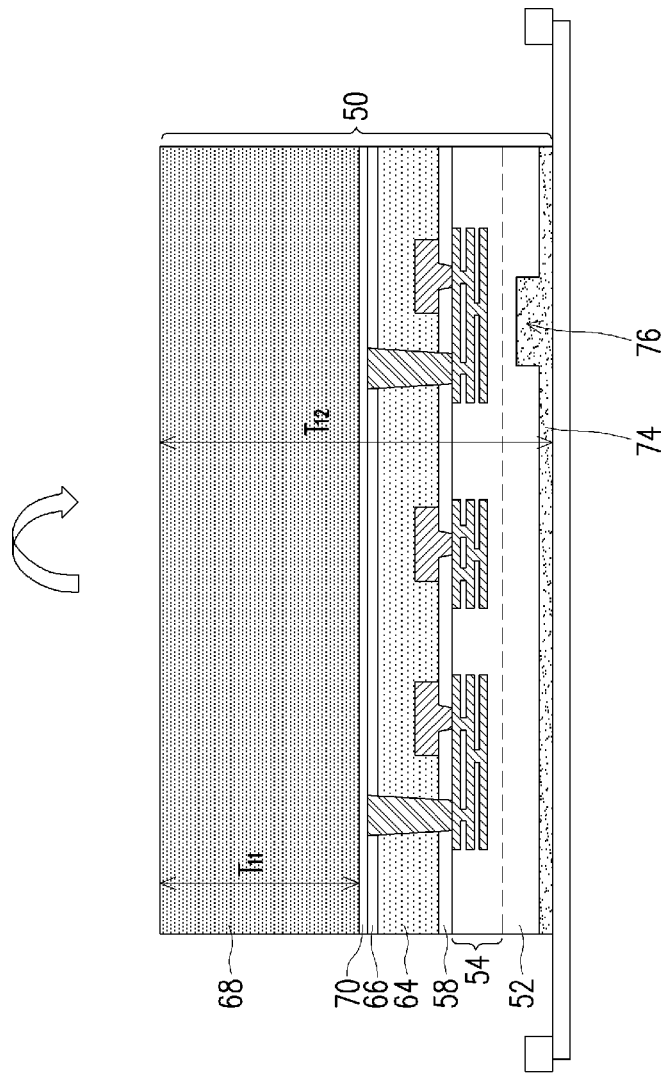

In FIG. 7, the wafer 40 is flipped and placed on tape. The carrier substrate 68 is then thinned until the dicing streets 78 are exposed, thereby completing singulation of the integrated circuit dies 50. Thinning may be accomplished by an etching process, a chemical-mechanical polish (CMP), a grinding process, or the like. A post-thinning clean may be performed to remove any residue from the thinning process. After the thinning, remaining portions of the carrier substrate 68 have a small thickness $T_{11}$, such as a thickness $T_{11}$ in the range of about 5 µm to about 20 µm, and the integrated circuit die 50 has a small thickness $T_{12}$, such as a thickness $T_{12}$ in the range of about 10 µm to about 40 µm. When processing is finished, the integrated circuit dies 50 can be removed from the tape.

FIGS. 8 through 13 are cross-sectional views of intermediate steps during a process for forming a die stack 80 (see FIG. 13), in accordance with some embodiments. The die stack 80 is formed by stacking multiple integrated circuit dies in a back-to-face manner, with the back side of a top integrated circuit die being bonded to the front side of a bottom integrated circuit die, and without the use of solder. The illustrated die stacking process is performed by bonding singulated integrated circuit dies 50 to device regions of an unsingulated wafer 90. The wafer 90 is similar to the wafer 40 of FIG. 2, e.g., is a wafer at an intermediate stage of processing before the carrier substrate 68 is attached, and has similar features as the wafer 40. Bonding of a first integrated circuit die 50A to a first device region 90A of the wafer 90 is illustrated, but it should be appreciated that the wafer 90 may have any number of device regions and any number of integrated circuit dies may be bonded to each region. A second integrated circuit die 50B is formed in the first device region 90A of the wafer 90, and is singulated to be included in the resulting die stack 80.

In the embodiment shown, the top integrated circuit die 50A and the bottom wafer 90 both include die connectors 62. In other embodiments (discussed further below), the top integrated circuit die 50A and/or the bottom wafer 90 may omit the die connectors 62. In other embodiments (discussed further below), the formation of the die connectors 62 may be deferred until after the top integrated circuit die 50A and bottom wafer 90 are bonded.

The integrated circuit dies of the resulting die stack 80 (see FIG. 13) are electrically isolated at the time of singulation. The integrated circuit dies of the die stack 80 can be dies for forming computing systems. For example, the bottom integrated circuit die 50B can be one type of integrated circuit die, such as a logic die, and the top integrated circuit die 50A can be a second type of integrated circuit die, such as a memory die, an integrated passive device, or the like. The die stack 80 will be packaged in subsequent processing to form package components, which electrically couples the integrated circuit dies of the die stack 80.

Figure 8:
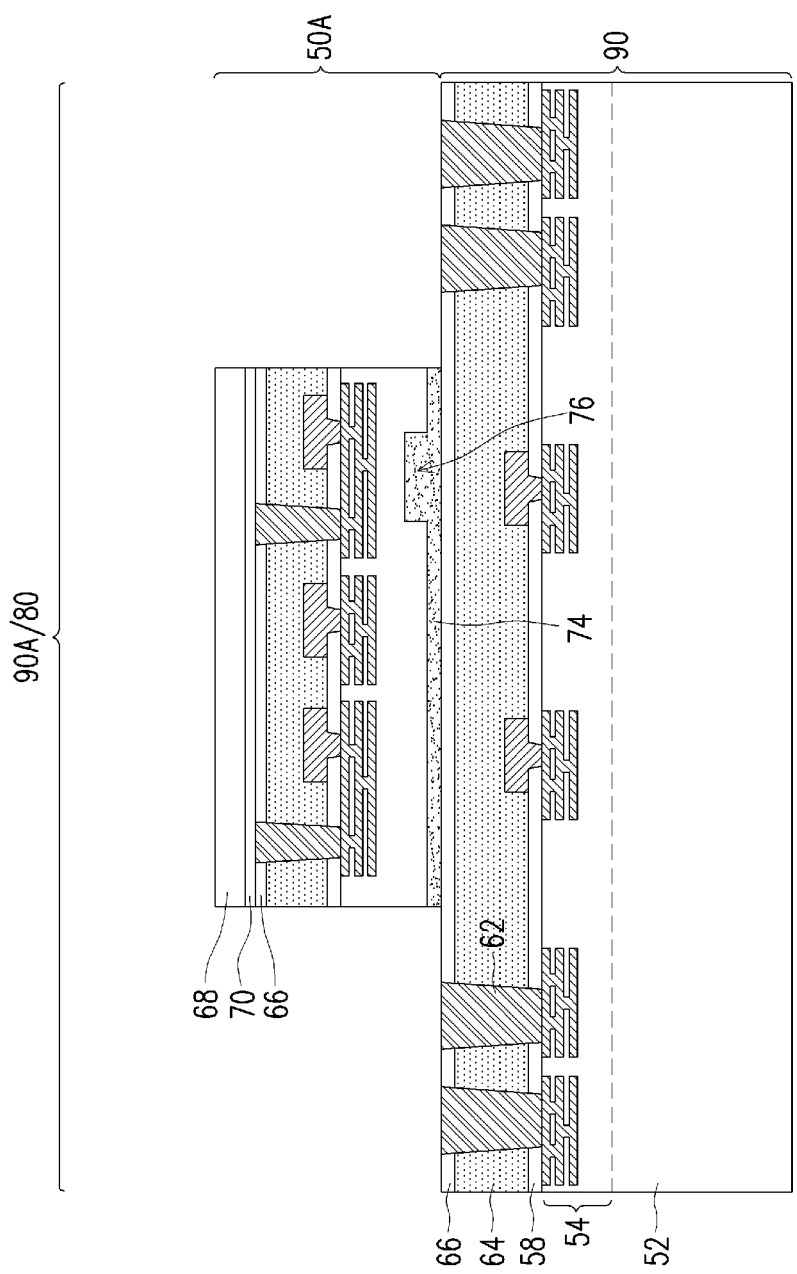
FIGS. 8 through 13 are cross-sectional views of intermediate steps during a process for forming a die stack, in accordance with some embodiments.

In FIG. 8, the top integrated circuit die 50A is bonded to the bottom wafer 90. The top integrated circuit die 50A is placed on the bottom wafer 90 using, e.g., a pick-and-place technique. In some embodiments, the top integrated circuit die 50A is bonded to a region of the first device region 90A that is free from die connectors 62. The alignment marks 76 are used for alignment during placement. In embodiments where the top integrated circuit die 50A is bonded to the bottom wafer 90 by fusion bonding, the bonding layers 66 and 74 are pressed together to form dielectric-to-dielectric bonds that directly bond the top integrated circuit die 50A to the bottom wafer 90. In embodiments where the bonding layer(s) 66 include a nitrogen-doped silicon oxide layer and the bonding layer 74 is a silicon nitride layer, the dielectric-to-dielectric bonds are oxide-to-nitride bonds. As noted above, the presence of nitrogen in the bonding layers 66 and/or 74 increases the strength of the dielectric-to-dielectric bonds. An annealing process may be performed to further strengthen the bonds. In some embodiments, one of the bonding layers 66 and 74 are omitted. For example, the bonding layer 74 can be omitted, and the top integrated circuit die 50A can be bonded to the bottom wafer 90 by pressing the semiconductor substrate 52 of the top integrated circuit die 50A to the bonding layer(s) 66 of the bottom wafer 90. Silicon-to-dielectric bonds are thus formed, directly bonding the top integrated circuit die 50A to the bottom wafer 90. In embodiments where the bonding layer(s) 66 include a silicon oxide layer, the silicon-to-dielectric bonds are silicon-to-oxide bonds. As discussed further below with respect to FIG. 16, in some embodiments, both of the bonding layers 66 and 74 can be omitted, and the top integrated circuit die 50A can be bonded to the bottom wafer 90 by other means.

Figure 9:
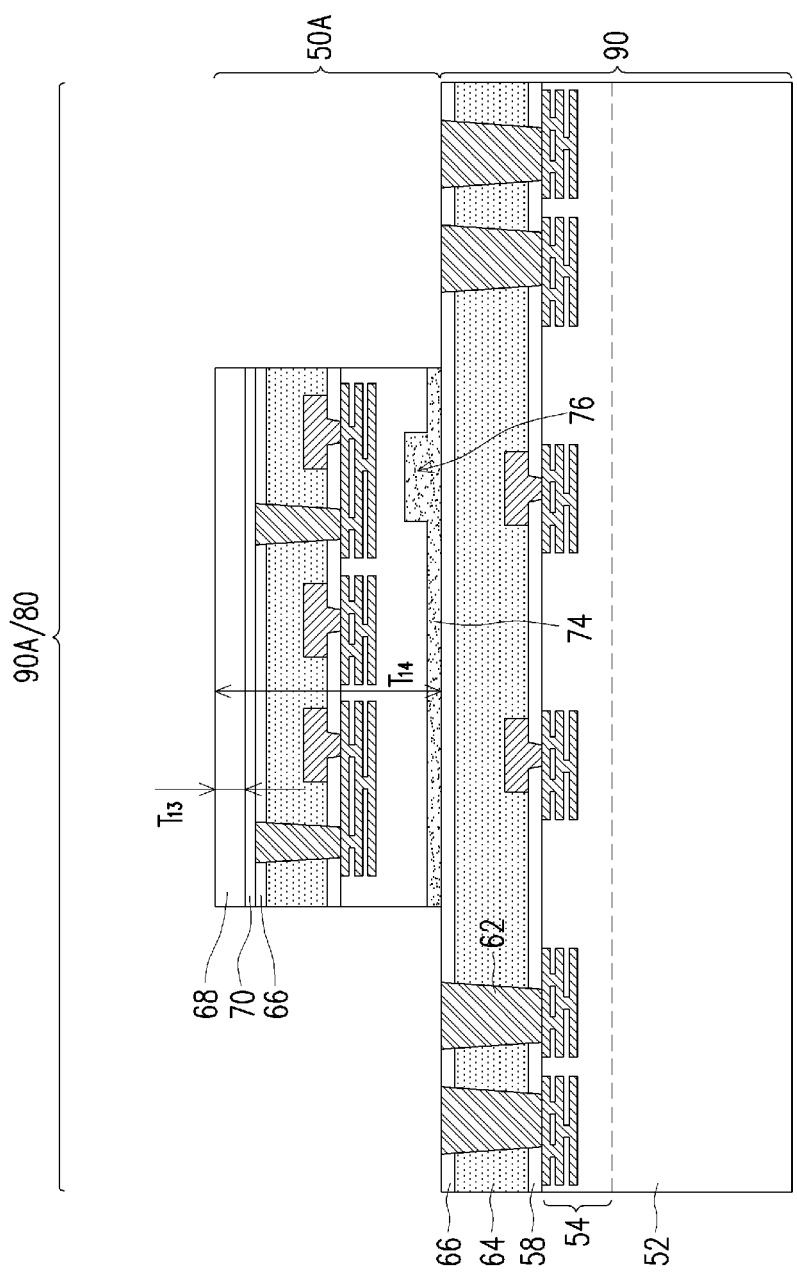

In FIG. 9, the carrier substrate 68 of the top integrated circuit die 50A is thinned. Thinning may be accomplished by an etching process, a chemical-mechanical polish (CMP), a grinding process, or the like. After the thinning, the remaining portions of the carrier substrate 68 have a small thickness $T_{13}$, such as a thickness $T_{13}$ in the range of about 1 µm to about 5 µm, and the top integrated circuit die 50A has a small thickness $T_{14}$, such as a thickness $T_{14}$ in the range of about 10 µm to about 25 µm.

Figure 10:
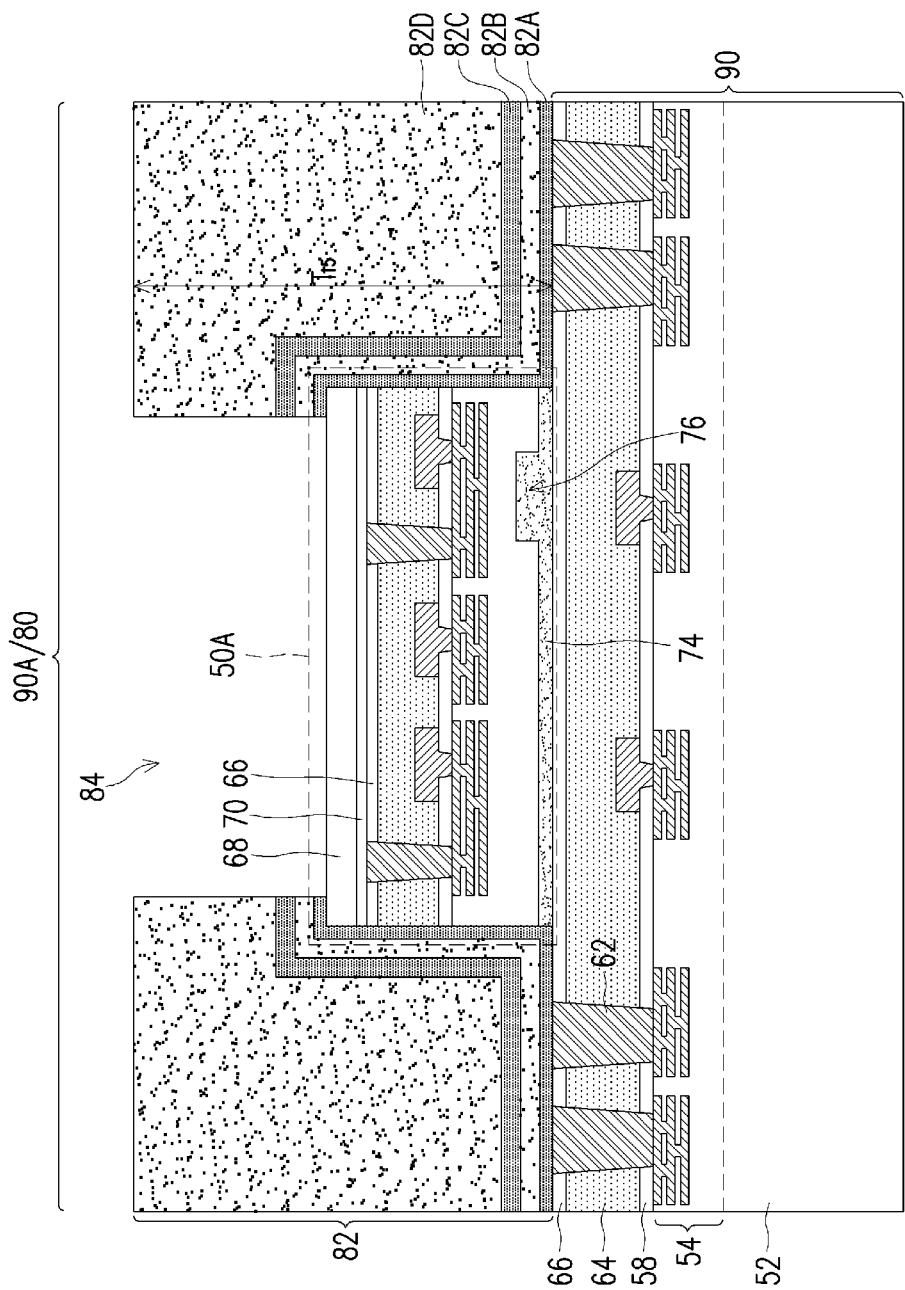

In FIG. 10, one or more dielectric layer(s) 82 are formed over the bottom wafer 90 and top integrated circuit die 50A. The dielectric layer(s) 82 are then patterned to form an opening 84 exposing the top integrated circuit die 50A. Each of the dielectric layer(s) 82 may be a polymer such as PBO, polyimide, BCB, or the like; a nitride such as silicon nitride or the like; an oxide such as silicon oxide, PSG, BSG, BPSG, or the like; TEOS; the like; or a combination thereof. The dielectric layer(s) 82 may be formed, for example, by spin coating, lamination, chemical vapor deposition (CVD), or the like. After formation, the dielectric layer(s) 82 have a combined thickness $T_{15}$, such as a thickness $T_{15}$ in the range of about 12 µm to about 27 µm. The opening 84 is then formed, exposing the carrier substrate 68 of the top integrated circuit die 50A. The opening 84 may be formed by acceptable photolithography and etching techniques, such as by using a patterned photoresist as an etching mask. Forming the opening 84 may help reduce pattern loading effects in a subsequent planarization process.

In some embodiments, the dielectric layer(s) 82 include a first silicon nitride layer 82A, a first TEOS layer 82B on the first silicon nitride layer 82A, a second silicon nitride layer 82C on the first TEOS layer 82B, and a second TEOS layer 82D on the second silicon nitride layer 82C. The first silicon nitride layer 82A may be formed to a thickness in the range of about 100 Å to about 750 Å, the first TEOS layer 82B may be formed to a thickness in the range of about 10 kÅ to about 20 kÅ, the second silicon nitride layer 82C may be formed to a thickness in the range of about 1 kÅ to about 4 kÅ, and the second TEOS layer 82D may be formed to a thickness in the range of about 15 µm to about 25 µm.

Figure 11:
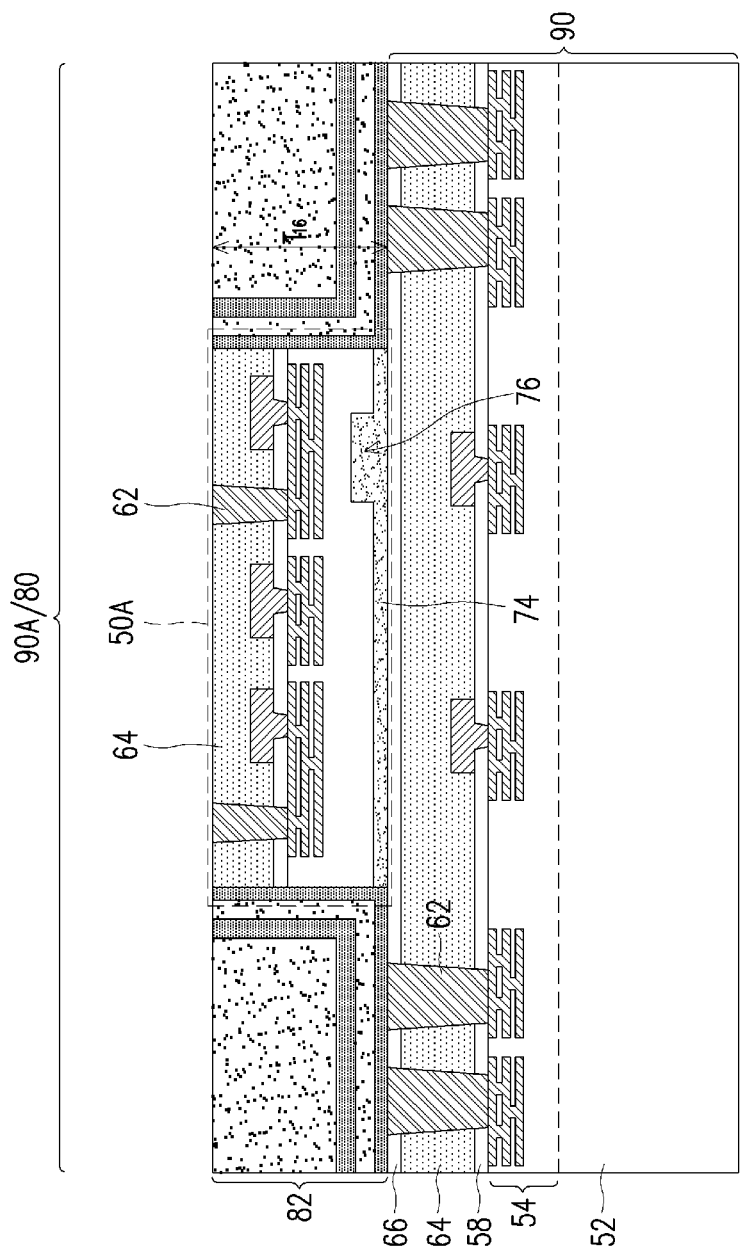

In FIG. 11, a planarization process is performed to remove portions of the dielectric layer(s) 82 over the top integrated circuit die 50A. The planarization may be performed by an etching process, a chemical-mechanical polish (CMP), a grinding process, or the like. The planarization removes the carrier substrate 68 and the bonding layers 66 and 70. After the planarization, the die connectors 62 (when formed) are exposed, and topmost surfaces of the dielectric layers 64 and 82 and die connectors 62 (when formed) are planar. The planarization may also thin the top integrated circuit die 50A. After the planarization, the top integrated circuit die 50A has a thickness $T_{16}$, such as a thickness $T_{16}$ in the range of about 5 µm to about 50 µm.

Figure 12:
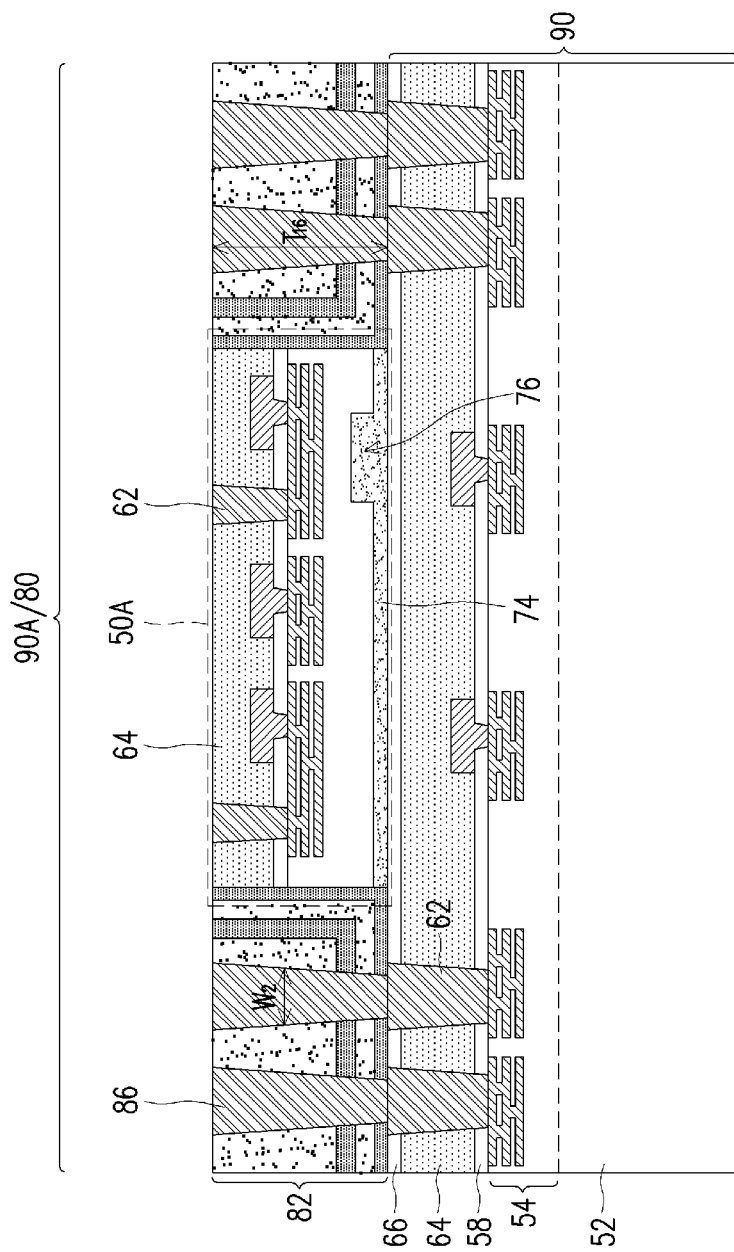

In FIG. 12, through vias 86 are formed extending through the dielectric layer(s) 82. The through vias 86 may be die connectors or conductive pillars, and may be formed of a conductive material, such as a metal. The through vias 86 are physically and electrically coupled to the die connectors 62 of the bottom wafer 90. The through vias 86 may be formed by a damascene process, such as a single damascene process. As an example to form the through vias 86, openings may be formed in the dielectric layer(s) 82 exposing the die connectors 62. The openings may be formed by acceptable photolithography and etching techniques, such as by using a patterned photoresist as an etching mask for an etching process. A seed layer may be formed in the openings and on the exposed portions of the die connectors 62. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A conductive material is formed in the openings of the dielectric layer(s) 82 and on the seed layer. The conductive material may be formed by plating, such as electroplating or electroless plating, or the like. The conductive material may comprise a metal, such as copper, titanium, tungsten, aluminum, or the like. Excess portions of the conductive material and seed layer outside of the openings may be removed by, e.g., a grinding process or a CMP process. The remaining portions of the seed layer and conductive material form the through vias 86. The through vias 86 are formed to the thickness $T_{16}$, and are formed to a width $W_2$, such as a width $W_2$ in the range of about 1 µm to about 10 µm. In some embodiments, the through vias 86 include additional layers, such as barrier layers, liner layers, or the like. The through vias 86 do not comprise, e.g., are free from solder.

Figure 13:
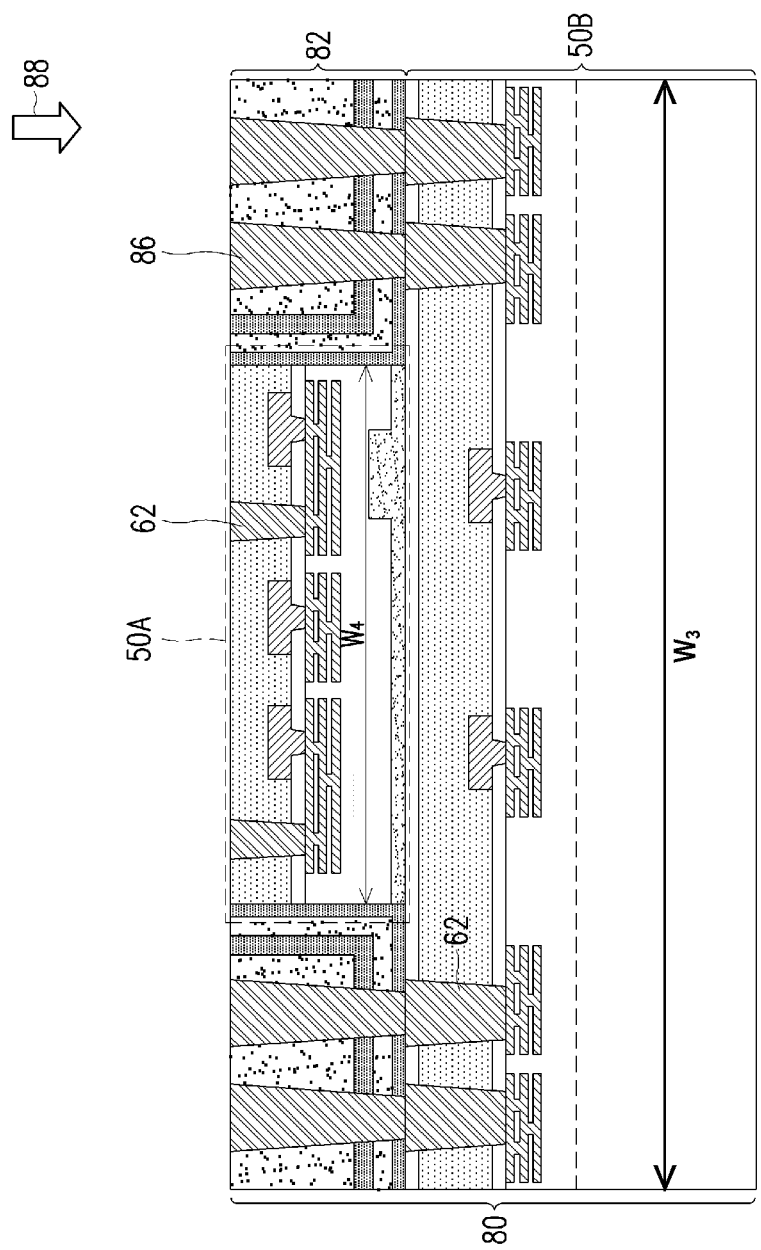

In FIG. 13, a singulation process 88 is performed by sawing along scribe line regions, e.g., around the first device region 90A. The singulation process 88 separates the first device region 90A from adjacent device regions (not shown) of the bottom wafer 90. The resulting, singulated die stack 80 is from the first device region 90A of the bottom wafer 90, and includes a top integrated circuit die 50A and a bottom integrated circuit die 50B stacked in a back-to-face manner, without the use of solder. The resulting die stack 80 is thus free from solder. After singulation, the dielectric layer(s) 82 are laterally coterminous with the bottom integrated circuit die 50B. After the singulation process 88, the bottom integrated circuit die 50B has a width $W_3$, and the top integrated circuit die 50A has a width $W_4$. The width $W_3$ can be in the range of about 10 mm to about 100 mm and the width $W_4$ can be in the range of about 1 mm to about 10 mm. The width $W_3$ is greater than the width $W_4$, which helps accommodate the die connectors 62 for the bottom integrated circuit die 50B and the through vias 86.

Figure 14:
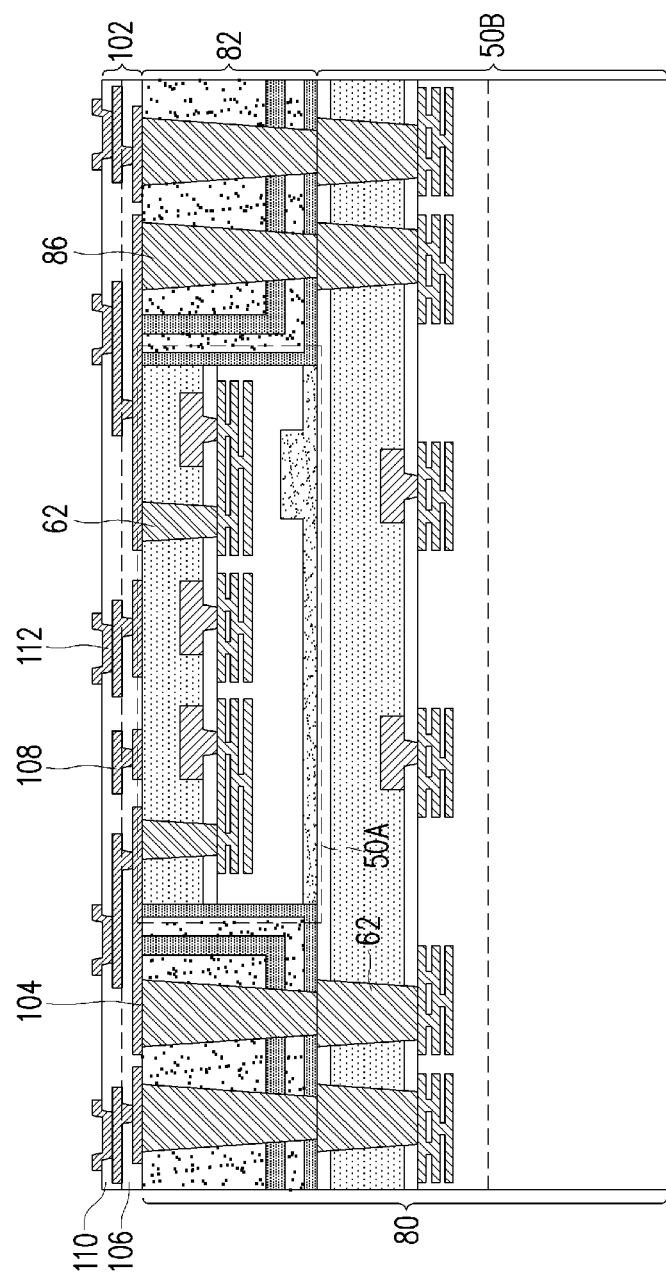
FIGS. 14 and 15 are cross-sectional views of intermediate steps during a process for forming an integrated circuit package, in accordance with some embodiments.
Figure 15:
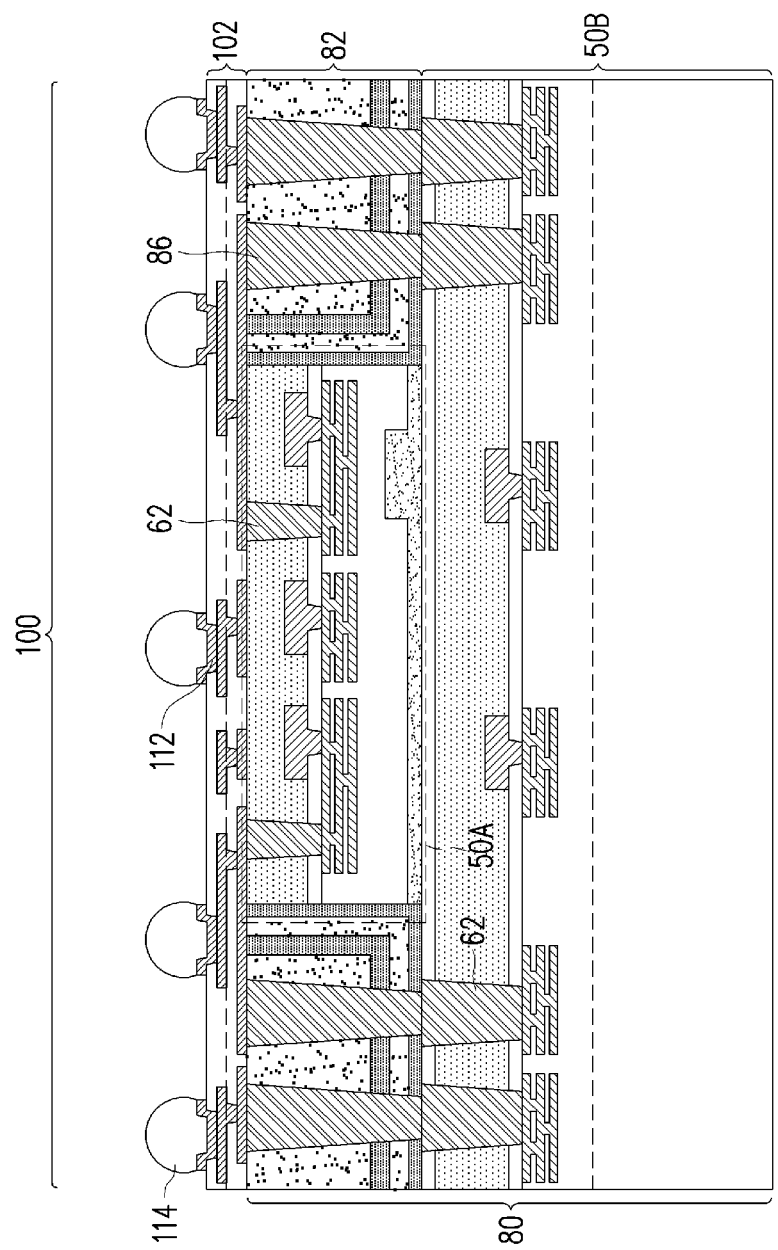

FIGS. 14 and 15 are cross-sectional views of intermediate steps during a process for forming an integrated circuit package 100, in accordance with some embodiments. After formation of the integrated circuit package 100 (see FIG. 15), the top integrated circuit die 50A and bottom integrated circuit die 50B are electrically coupled to form completed systems.

In FIG. 14, a redistribution structure 102 is formed over the die stack 80. In particular, the redistribution structure 102 is formed over the through vias 86, dielectric layer(s) 82, and top integrated circuit die 50A. The redistribution structure 102 electrically couples the top integrated circuit die 50A to the bottom integrated circuit die 50B. In particular, the redistribution structure 102 is electrically coupled to the top integrated circuit die 50A by the die connectors 62, and is electrically coupled to the bottom integrated circuit die 50B by the die connectors 62 and through vias 86.

The redistribution structure 102 includes dielectric layers 106 and 110; metallization patterns 104 and 108, and under-bump metallurgies (UBMs) 112. The metallization patterns may also be referred to as redistribution layers or redistribution lines. The metallization patterns 104 and 108 have fine pitches, such as pitches in the range of about 0.8 µm to about 5 µm. As such, the metallization patterns 104 and 108 may be used to interconnect the top integrated circuit die 50A and bottom integrated circuit die 50B, without the use of TSVs in the integrated circuit dies 50, and without the use of interposers. In other words, the redistribution structure 102 advantageously allows the integrated circuit dies 50 to be free from TSVs, and allows the integrated circuit package 100 (see FIG. 15) to be free from interposers.

The redistribution structure 102 is shown as an example having two layers of metallization patterns. More or fewer dielectric layers and metallization patterns may be formed in the redistribution structure 102. If fewer dielectric layers and metallization patterns are to be formed, steps and process discussed below may be omitted. If more dielectric layers and metallization patterns are to be formed, steps and processes discussed below may be repeated.

Initially, the metallization pattern 104 is formed. The metallization pattern 104 includes line portions (also referred to as conductive lines) on and extending along the major surfaces of the dielectric layer(s) 82. In some embodiments, a dielectric layer (not shown) may be formed over the dielectric layer(s) 82, the integrated circuit die 50, and the through vias 86, and the metallization pattern 104 extends through the dielectric layer (not shown). The metallization pattern 104 physically and electrically couples the through vias 86 to the die connectors 62 of the top integrated circuit die 50A. As an example to form the metallization pattern 104, a seed layer is formed over the through vias 86, dielectric layer(s) 82, and the top integrated circuit die 50A. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 104. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 104. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layer 106 is then deposited on the metallization pattern 104, dielectric layer(s) 82, and top integrated circuit die 50A. In some embodiments, the dielectric layer 106 is formed of a photo-sensitive material such as PBO, polyimide, BCB, or the like, which may be patterned using a lithography mask. The dielectric layer 106 may be formed by spin coating, lamination, CVD, the like, or a combination thereof. The dielectric layer 106 is then patterned. The patterning forms openings exposing portions of the metallization pattern 104. The patterning may be by an acceptable process, such as by exposing the dielectric layer 106 to light when the dielectric layer 106 is a photo-sensitive material or by etching using, for example, an anisotropic etch. If the dielectric layer 106 is a photo-sensitive material, the dielectric layer 106 can be developed after the exposure.

The metallization pattern 108 is then formed. The metallization pattern 108 includes line portions (also referred to as conductive lines) on and extending along the major surface of the dielectric layer 106. The metallization pattern 108 further includes via portions (also referred to as conductive vias) extending through the dielectric layer 106 to physically and electrically couple the metallization pattern 104. As an example to form the metallization pattern 108, a seed layer is formed over the dielectric layer 106 and in the openings extending through the dielectric layer 106. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 108. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 108. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layer 110 is then deposited on the metallization pattern 108 and dielectric layer 106. In some embodiments, the dielectric layer 110 is formed of a photo-sensitive material such as PBO, polyimide, BCB, or the like, which may be patterned using a lithography mask. The dielectric layer 110 may be formed by spin coating, lamination, CVD, the like, or a combination thereof. The dielectric layer 110 is then patterned. The patterning forms openings exposing portions of the metallization pattern 108. The patterning may be by an acceptable process, such as by exposing the dielectric layer 110 to light when the dielectric layer 110 is a photo-sensitive material or by etching using, for example, an anisotropic etch. If the dielectric layer 110 is a photo-sensitive material, the dielectric layer 110 can be developed after the exposure.

The UBMs 112 are then formed for external connection to the redistribution structure 102. The UBMs 112 have bump portions on and extending along the major surface of the dielectric layer 110, and have via portions extending through the dielectric layer 110 to physically and electrically couple the metallization pattern 108. As a result, the UBMs 112 are electrically coupled to the top integrated circuit die 50A and bottom integrated circuit die 50B. In some embodiments, the UBMs 112 are formed to a different size than the metallization patterns 104 and 108. As an example to form the UBMs 112, a seed layer is formed over the dielectric layer 110 and in the openings extending through the dielectric layer 110. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 112. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the UBMs 112. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

In FIG. 15, conductive connectors 114 are formed on the UBMs 112. The conductive connectors 114 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 114 may include a conductive material such as solder, copper, aluminum, gold, nickel, silver, palladium, tin, the like, or a combination thereof. In some embodiments, the conductive connectors 114 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 114 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Although the integrated circuit package 100 is described as being formed after the die stack 80 is singulated, the ordering of steps may be modified. For example, in embodiments where wafer-level packaging is used, the redistribution structure 102 can be formed over an unsingulated wafer 90, e.g., the intermediate structure of FIG. 12. Multiple integrated circuit packages 100 may thus be formed at the wafer-level. The singulation process 88 (see FIG. 13) can then be performed to singulate the die stacks 80 and redistribution structure 102 and thus form the integrated circuit packages 100.

Figure 16:
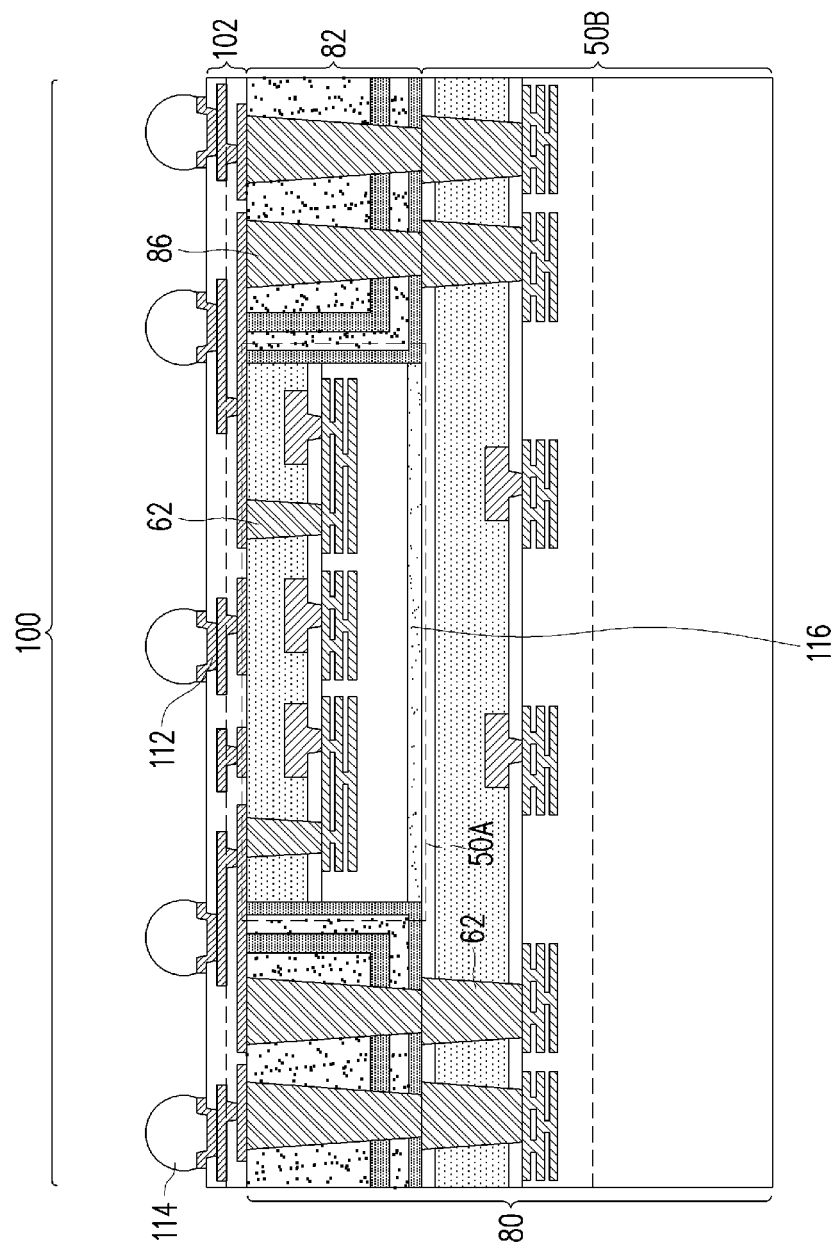
FIG. 16 is a cross-sectional view of an integrated circuit package, in accordance with some other embodiments.

FIG. 16 is a cross-sectional view of an integrated circuit package 100, in accordance with some other embodiments. In this embodiment, both of the bonding layers 66 and 74 are omitted, and the semiconductor substrate 52 of the top integrated circuit die 50A is bonded to the dielectric layer 64 of the bottom wafer 90 by an adhesive 116. The adhesive 116 can be any suitable adhesive, epoxy, die attach film (DAF), or the like.

FIGS. 17 through 22 are cross-sectional views of intermediate steps during a process for forming an integrated circuit package 200, in accordance with some other embodiments. The integrated circuit package 200 is formed by packaging a singulated die stack 80. After packaging, the top integrated circuit die 50A and bottom integrated circuit die 50B are electrically coupled to form completed systems.

Figure 17:
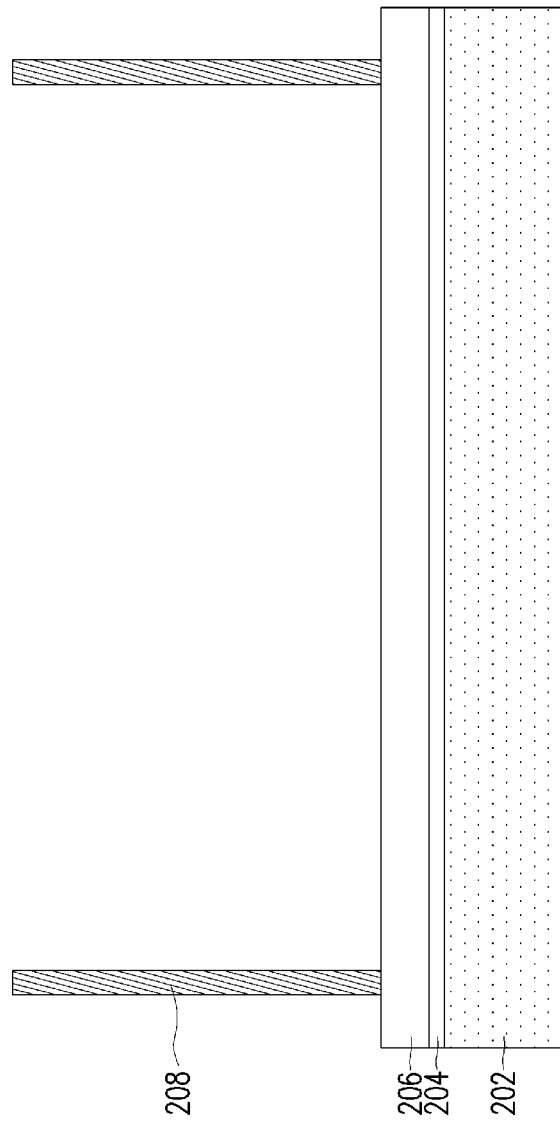
FIGS. 17 through 22 are cross-sectional views of intermediate steps during a process for forming an integrated circuit package, in accordance with some other embodiments.

In FIG. 17, a carrier substrate 202 is provided, and a release layer 204 is formed on the carrier substrate 202. The carrier substrate 202 may be a glass carrier substrate, a ceramic carrier substrate, or the like. The carrier substrate 202 may be a wafer, such that multiple packages can be formed on the carrier substrate 202 simultaneously. The release layer 204 may be formed of a polymer-based material, which may be removed along with the carrier substrate 202 from the overlying structures that will be formed in subsequent steps. In some embodiments, the release layer 204 is an epoxy-based thermal-release material, which loses its adhesive property when heated, such as a light-to-heat-conversion (LTHC) release coating. In other embodiments, the release layer 204 may be an ultra-violet (UV) glue, which loses its adhesive property when exposed to UV lights. The release layer 204 may be dispensed as a liquid and cured, may be a laminate film laminated onto the carrier substrate 202, or may be the like. The top surface of the release layer 204 may be leveled and may have a high degree of planarity.

A dielectric layer 206 is then formed on the release layer 204. The bottom surface of the dielectric layer 206 may be in contact with the top surface of the release layer 204. In some embodiments, the dielectric layer 206 is formed of a polymer, such as polybenzoxazole (PBO), polyimide, benzocyclobutene (BCB), or the like. In other embodiments, the dielectric layer 206 is formed of a nitride such as silicon nitride; an oxide such as silicon oxide, PSG, BSG, BPSG, or the like; or the like. The dielectric layer 206 may be formed by any acceptable deposition process, such as spin coating, CVD, laminating, the like, or a combination thereof.

Next, through vias 208 are formed on and extending away from the dielectric layer 206. As an example to form the through vias 208, a seed layer is formed on the dielectric layer 206. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to through vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 208.

Figure 18:
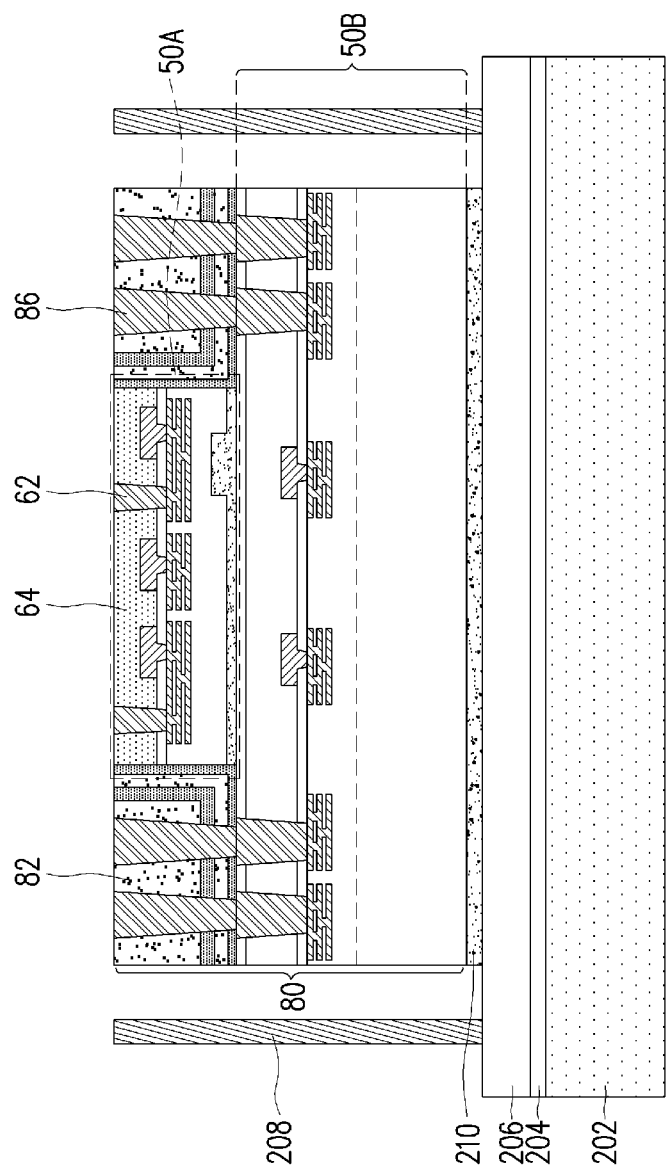

In FIG. 18, die stacks 80 are adhered to the dielectric layer 206 by an adhesive 210. A desired type and quantity of die stacks 80 are adhered to the dielectric layer 206. In the embodiment shown, one die stack 80 is adhered to the dielectric layer 206. The adhesive 210 is on the back side of the die stack 80, e.g., on the back side of the bottom integrated circuit die 50B, and adheres the die stack 80 to the dielectric layer 206. The adhesive 210 may be any suitable adhesive, epoxy, die attach film (DAF), or the like. The adhesive 210 may be applied to the back side of the die stack 80 or may be applied over the surface of the carrier substrate 202. For example, the adhesive 210 may be applied to the back side of the die stack 80 before the die stack 80 is singulated.

Figure 19:
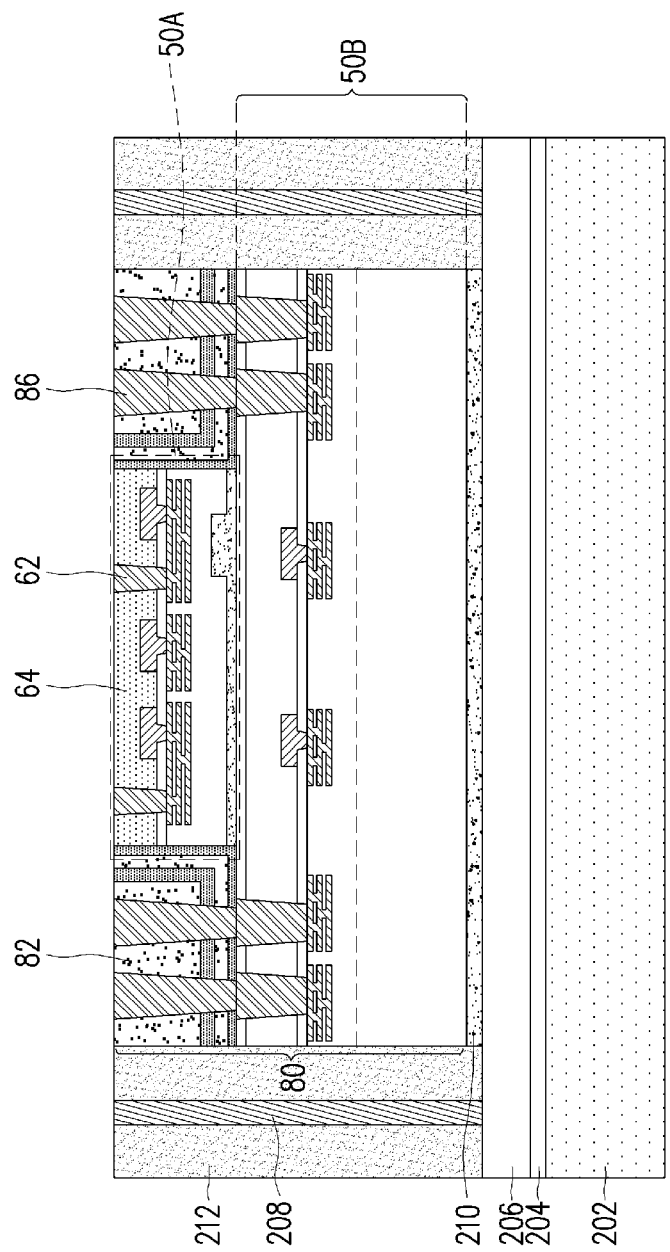

In FIG. 19, an encapsulant 212 is formed on and around the various components. After formation, the encapsulant 212 encapsulates the through vias 208 and die stack 80. The encapsulant 212 may be a molding compound, epoxy, or the like. The encapsulant 212 may be applied by compression molding, transfer molding, or the like, and may be formed over the carrier substrate 202 such that the through vias 208 and/or the die stack 80 are buried or covered. The encapsulant 212 may be applied in liquid or semi-liquid form and then subsequently cured.

A planarization process may be performed on the encapsulant 212 to expose the through vias 208 and die stack 80. The planarization process may remove material of the through vias 208, through vias 86, dielectric layer(s) 82, dielectric layer 64, and/or die connectors 62 until the die connectors 62, through vias 86, and through vias 208 are exposed. Top surfaces of the encapsulant 212, through vias 86, through vias 208, dielectric layer(s) 82, dielectric layer 64, and die connectors 62 are coplanar after the planarization process. The planarization process may be, for example, a chemical-mechanical polish (CMP), a grinding process, or the like.

Figure 20:
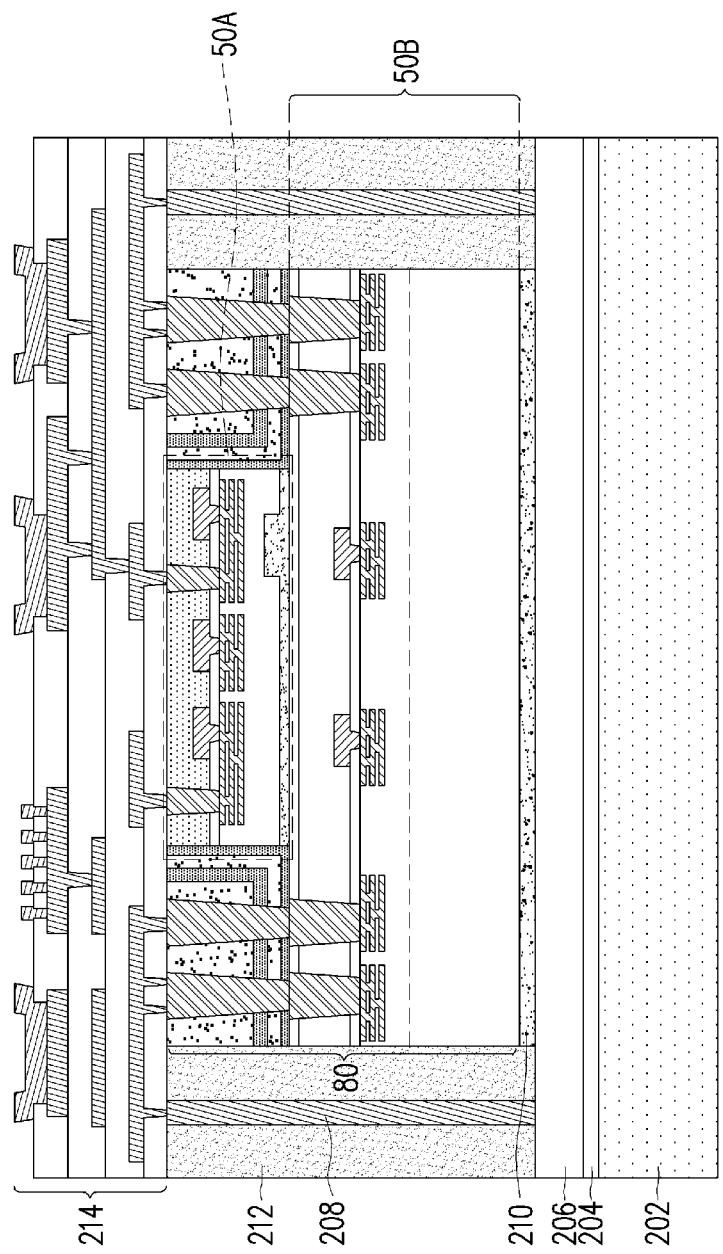

In FIG. 20, a redistribution structure 214 is formed over the encapsulant 212, through vias 208, and die stack 80. The redistribution structure 214 electrically couples the top integrated circuit die 50A and bottom integrated circuit die 50B. The redistribution structure 214 includes dielectric layers, metallization patterns, and UBMs. The metallization patterns of the redistribution structure 214 have fine pitches, such as pitches in the range of about 0.8 µm to about 5 µm. As such, the metallization patterns may be used to interconnect the top integrated circuit die 50A and bottom integrated circuit die 50B, without the use of TSVs in the integrated circuit dies 50, and without the use of interposers. The redistribution structure 214 may be formed using a similar process as the process for forming the redistribution structure 102. The redistribution structure 214 is shown as an example having three layers of metallization patterns. More or fewer dielectric layers and metallization patterns may be formed in the redistribution structure 214.

Figure 21:
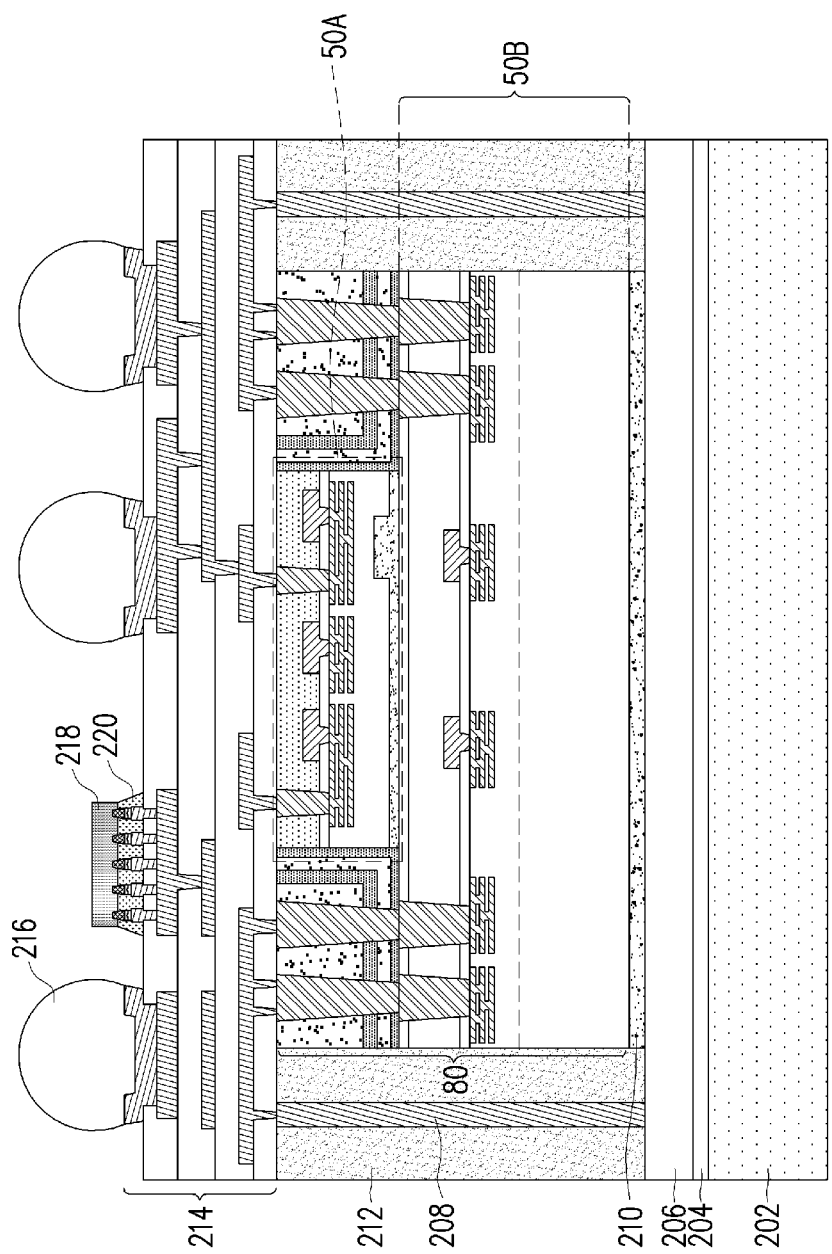

In FIG. 21, conductive connectors 216 are formed on the redistribution structure 214. For example, the conductive connectors 216 may be formed on UBMs that are part of the redistribution structure 214. The conductive connectors 216 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 216 may include a conductive material such as solder, copper, aluminum, gold, nickel, silver, palladium, tin, the like, or a combination thereof. In some embodiments, the conductive connectors 216 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 216 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Further, passive devices 218 may be attached to the redistribution structure 214. For example, the passive devices 218 may be attached to UBMs that are part of the redistribution structure 214. The passive devices 218 may be integrated passive devices (IPDs) or discrete passive devices. The passive devices 218 may include resistors, capacitors, inductors, or the like, and may be attached to the redistribution structure 214 by conductive connectors. In some embodiments, an underfill 220 is formed between the passive devices 218 and the redistribution structure 214. The underfill 220 may be formed by a capillary flow process after the passive devices 218 are attached, or may be formed by a suitable deposition method before the passive devices 218 are attached.

Figure 22:
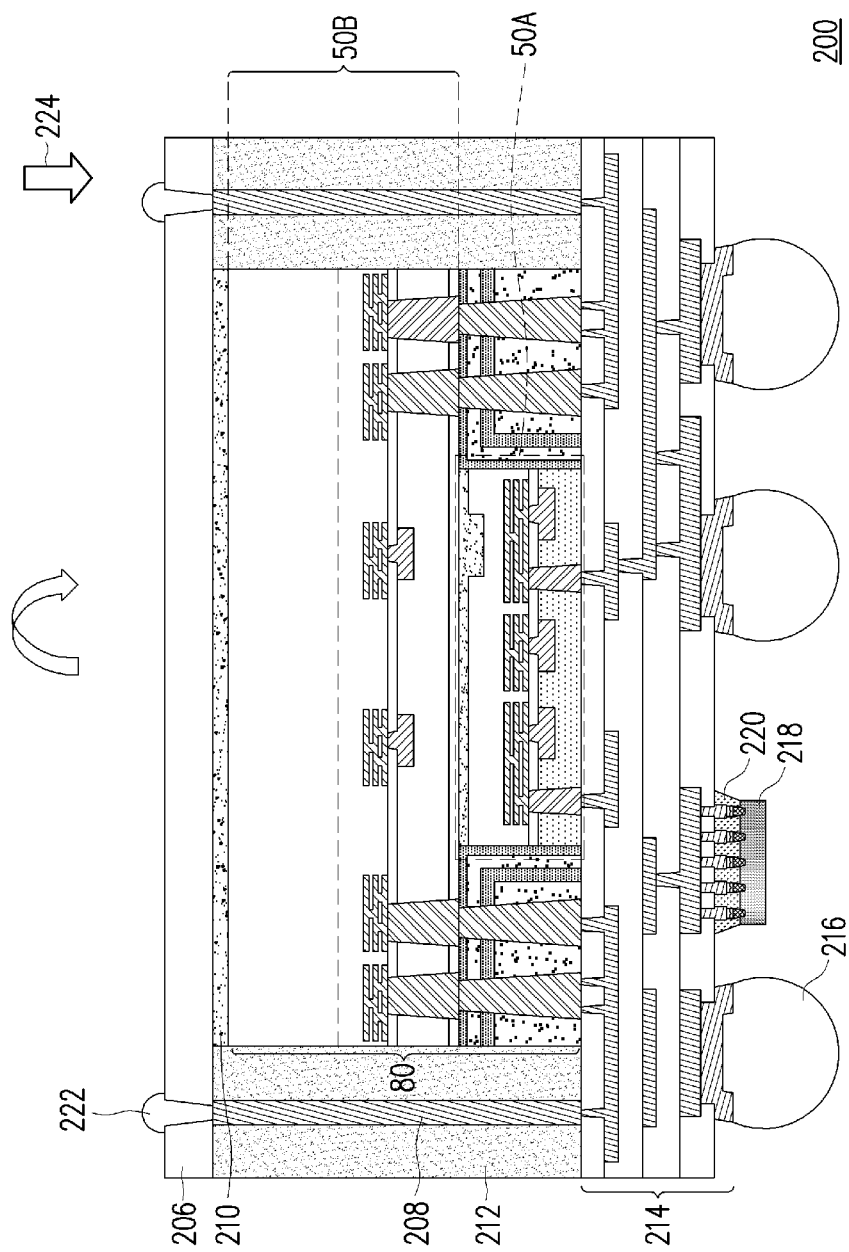

In FIG. 22, a carrier substrate de-bonding is performed to detach (or "de-bond") the carrier substrate 202 from the dielectric layer 206. In accordance with some embodiments, the de-bonding includes projecting a light such as a laser light or an UV light on the release layer 204 so that the release layer 204 decomposes under the heat of the light and the carrier substrate 202 can be removed. The structure is then flipped over and placed on a tape.

Conductive connectors 222 are then formed extending through the dielectric layer 206 to contact the through vias 208. Openings are formed through the dielectric layer 206 to expose portions of the through vias 208. The openings may be formed, for example, using laser drilling, etching, or the like. The conductive connectors 222 are formed in the openings. In some embodiments, the conductive connectors 222 comprise flux and are formed in a flux dipping process. In some embodiments, the conductive connectors 222 comprise a conductive paste such as solder paste, silver paste, or the like, and are dispensed in a printing process. In some embodiments, the conductive connectors 222 are formed in a manner similar to the conductive connectors 216, and may be formed of a similar material as the conductive connectors 216.

A singulation process 224 is performed by sawing along scribe line regions. The singulation process 224 separates the integrated circuit package 200 from adjacent integrated circuit packages. The resulting, singulated integrated circuit package 200 may be mounted to a package substrate with the conductive connectors 216. Other packages, such as memory devices, passive devices, or the like may be attached to the integrated circuit package 200 with the conductive connectors 222.

Figure 23:
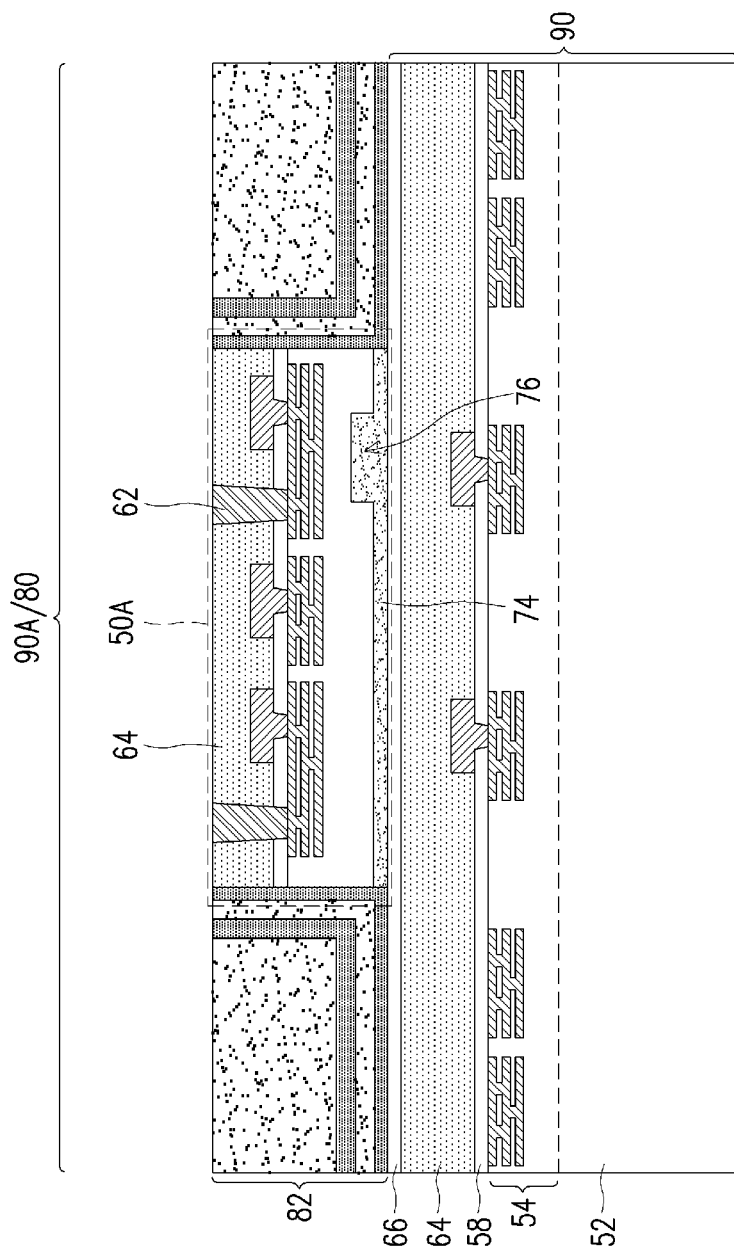
FIGS. 23 and 24 are cross-sectional views of intermediate steps during a process for forming a die stack, in accordance with other embodiments.
Figure 24:
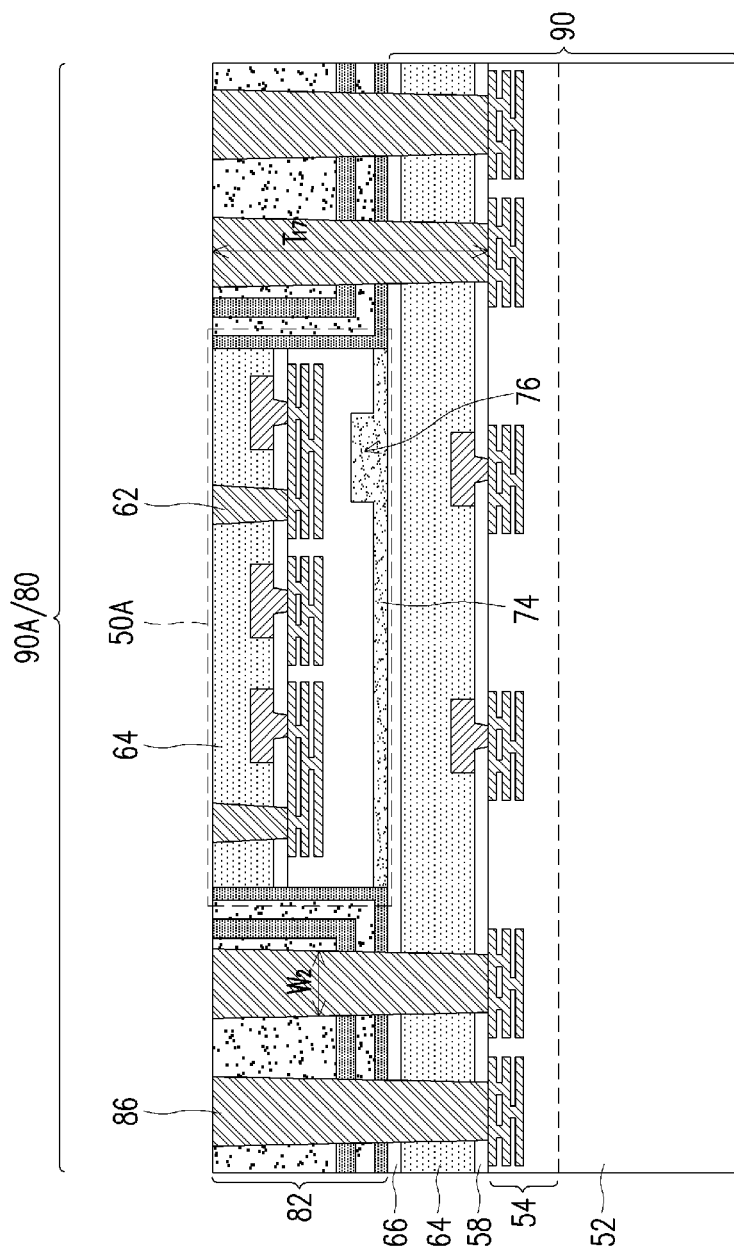

FIGS. 23 and 24 are cross-sectional views of intermediate steps during a process for forming a die stack 80, in accordance with other embodiments. FIG. 23 illustrates a die stack 80 in a similar state of processing as the intermediate structure of FIG. 11, except in this embodiment, the die connectors 62 are omitted during formation of the bottom wafer 90. As such, only the top integrated circuit die 50A has die connectors 62 after bonding.

In FIG. 24, the through vias 86 are formed extending through the passivation layer(s) 58, the bonding layer(s) 66, and the dielectric layers 64 and 82. The through vias 86 are thus electrically coupled to the bottom wafer 90. The through vias 86 may be formed by a damascene process, such as a single damascene process. The through vias 86 are formed to the width $W_2$, and may be formed to a thickness $T_{17}$, such as a thickness $T_{17}$ in the range of about 10 µm to about 30 µm After forming the through vias 86, a singulation process, such as the singulation process 88 (see FIG. 13), may be performed to singulate the die stack 80. The die stack 80 can be packaged to form an integrated circuit package. The integrated circuit package electrically couples the top integrated circuit die 50A and bottom integrated circuit die 50B. For example, processing as described above may be performed to form a package similar to the integrated circuit package 100 of FIG. 15, or a package similar to the integrated circuit package 200 of FIG. 22.

Figure 25:
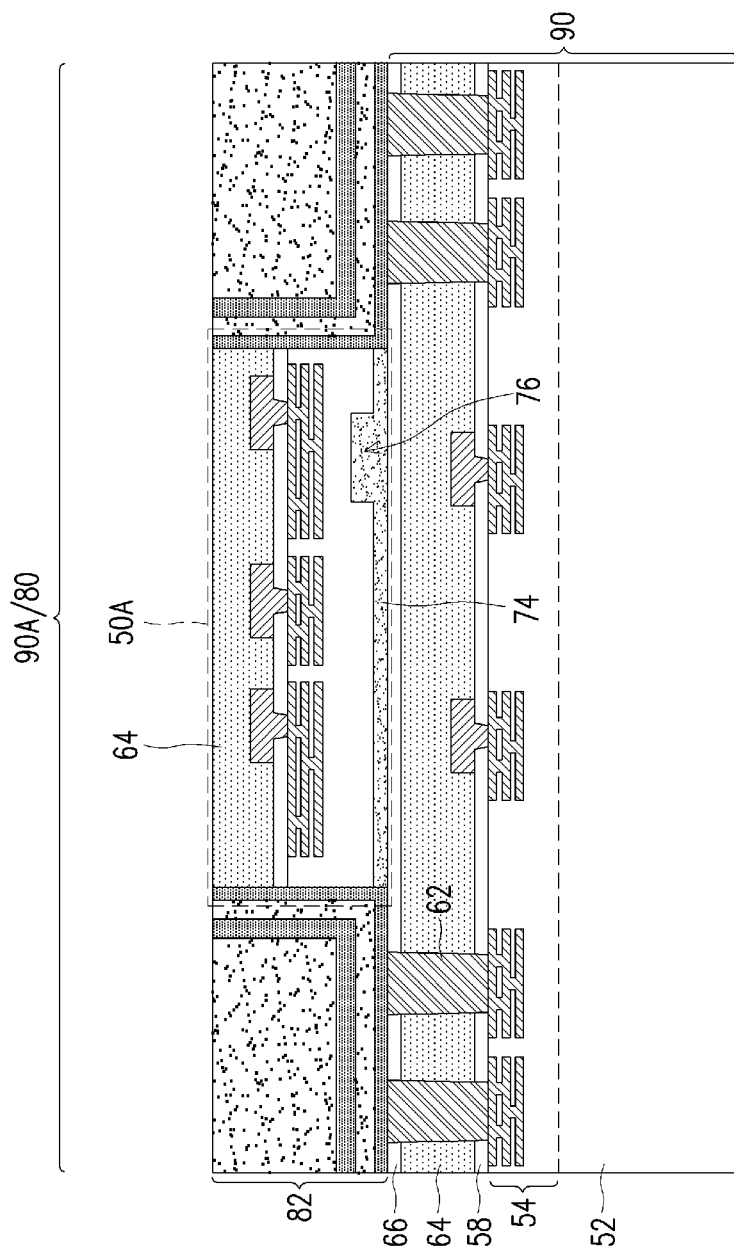
FIGS. 25 and 26 are cross-sectional views of intermediate steps during a process for forming a die stack, in accordance with other embodiments.
Figure 26:
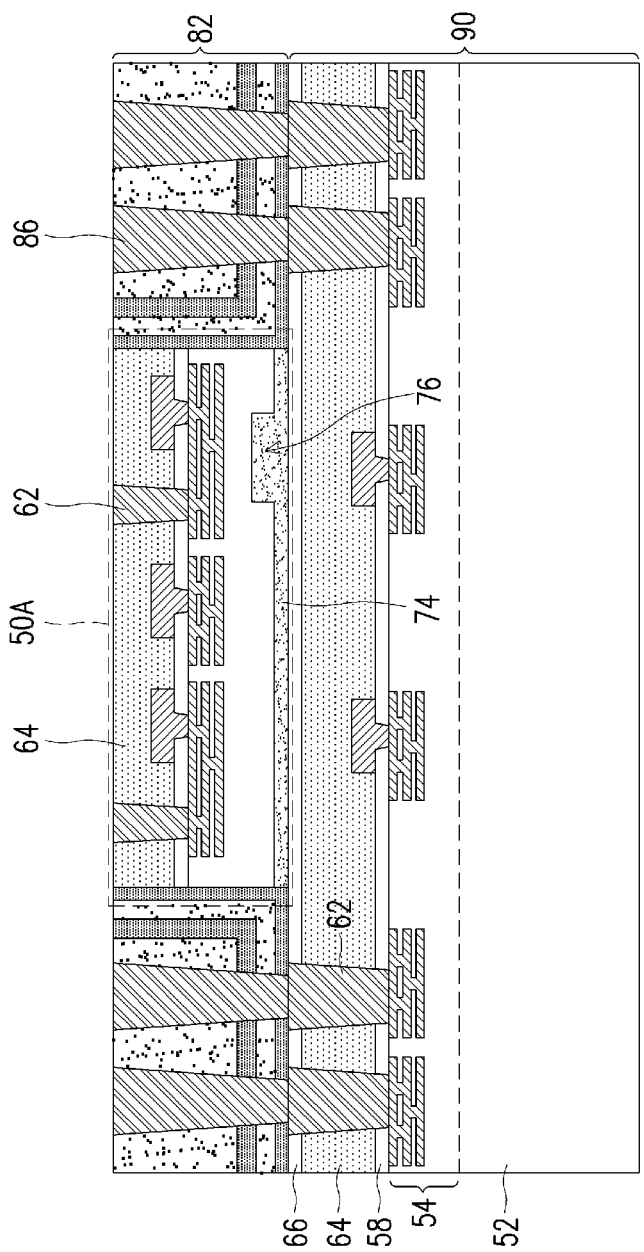

FIGS. 25 and 26 are cross-sectional views of intermediate steps during a process for forming a die stack 80, in accordance with other embodiments. FIG. 25 illustrates a die stack 80 in a similar state of processing as the intermediate structure of FIG. 11, except in this embodiment, the die connectors 62 are omitted during formation of the top integrated circuit die 50A. As such, only the bottom wafer 90 has die connectors 62 after bonding.

In FIG. 26, the die connectors 62 are formed in the top integrated circuit die 50A. The die connectors 62 extend through the dielectric layer 64 of the top integrated circuit die 50A to physically and electrically couple the top integrated circuit die 50A. The die connectors 62 may be formed by a damascene process, such as a single damascene process.

Further, the through vias 86 are formed extending through the dielectric layer(s) 82. The through vias 86 are thus electrically coupled to the die connectors 62 of the bottom wafer 90. The through vias 86 may be formed by a damascene process, such as a single damascene process. In some embodiments, the die connectors 62 for the top integrated circuit die 50A and the through vias 86 are formed simultaneously, e.g., in a same damascene process that uses a single mask to pattern openings for the die connectors 62 and the through vias 86. In some embodiments, the die connectors 62 for the top integrated circuit die 50A and the through vias 86 are formed in different processes, e.g., in different damascene processes that use different masks to pattern openings for the die connectors 62 and through vias 86.

After forming the die connectors 62 and through vias 86, a singulation process, such as the singulation process 88 (see FIG. 13), may be performed to singulate the die stack 80. The die stack 80 can be packaged to form an integrated circuit package. The integrated circuit package electrically couples the top integrated circuit die 50A and bottom integrated circuit die 50B. For example, processing as described above may be performed to form a package similar to the integrated circuit package 100 of FIG. 15, or a package similar to the integrated circuit package 200 of FIG. 22.

Figure 27:
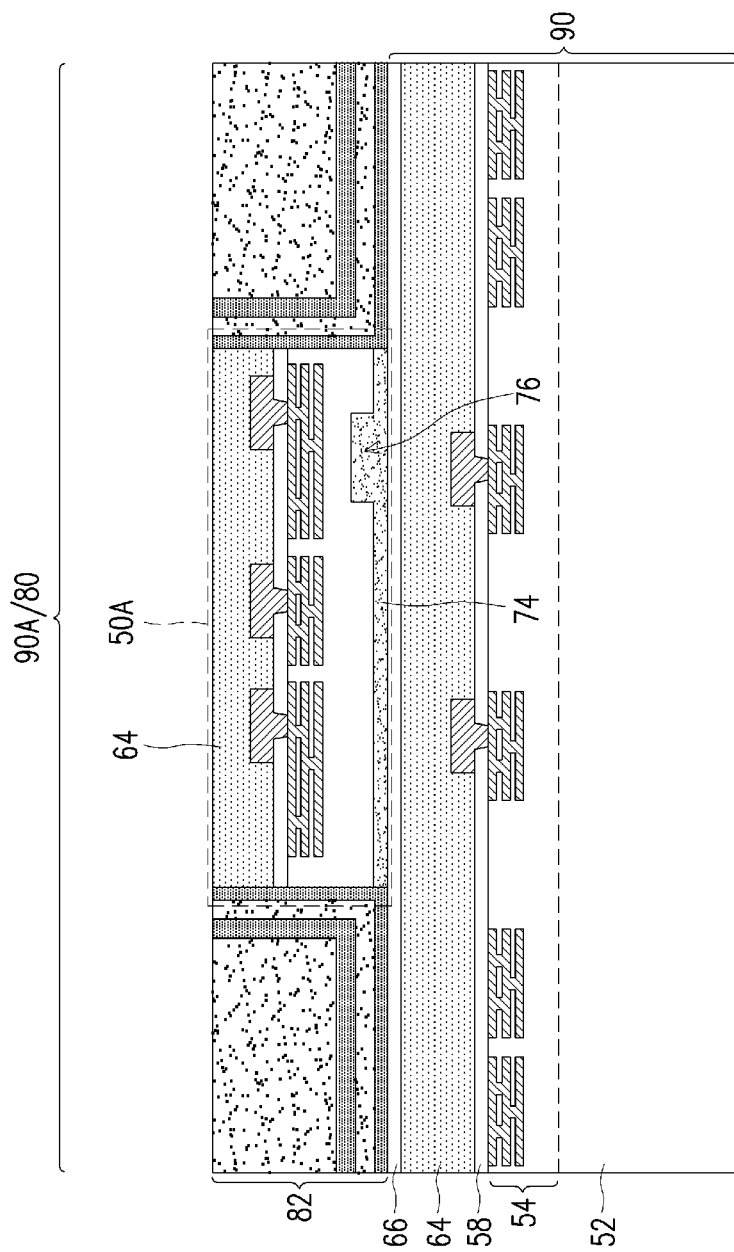
FIGS. 27 and 28 are cross-sectional views of intermediate steps during a process for forming a die stack, in accordance with other embodiments.
Figure 28:
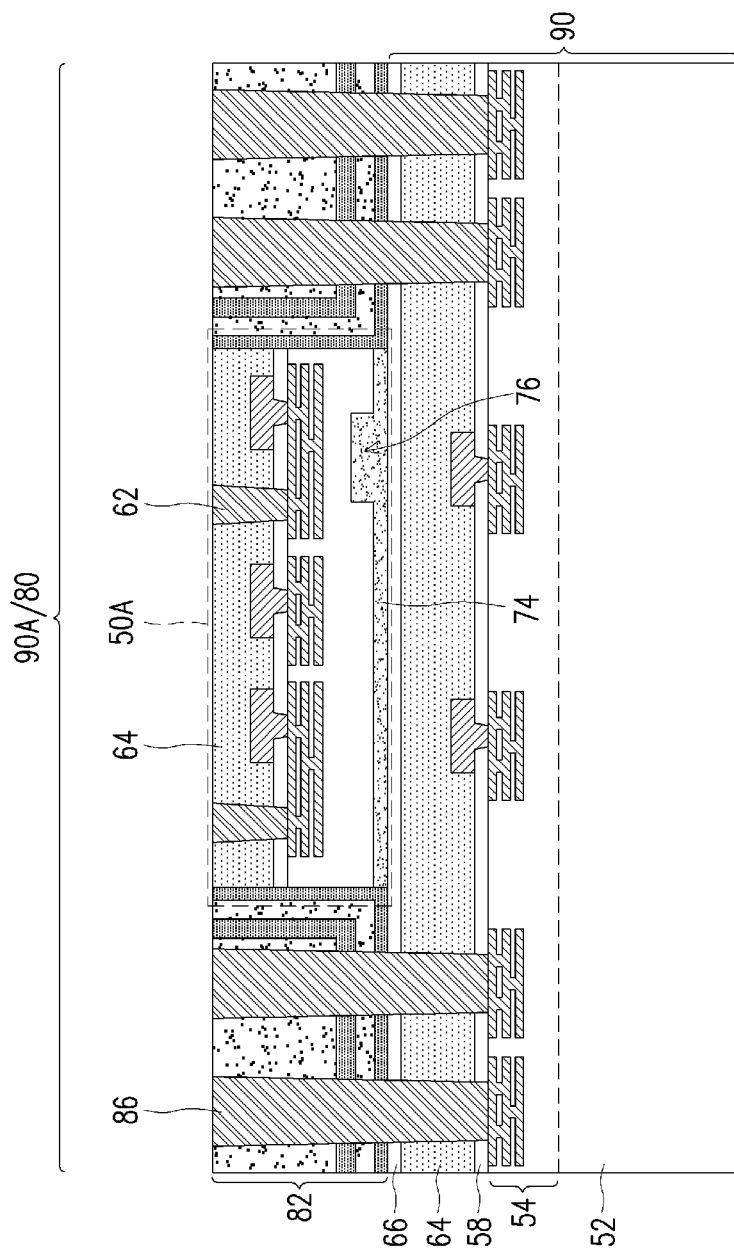

FIGS. 27 and 28 are cross-sectional views of intermediate steps during a process for forming a die stack 80, in accordance with other embodiments. FIG. 27 illustrates a die stack 80 in a similar state of processing as the intermediate structure of FIG. 11, except in this embodiment, the die connectors 62 are omitted during formation of both the top integrated circuit die 50A and the bottom wafer 90. As such, neither device has die connectors 62 prior to bonding.

In FIG. 28, the die connectors 62 are formed in the top integrated circuit die 50A. The die connectors 62 extend through the dielectric layer 64 of the top integrated circuit die 50A to physically and electrically couple the top integrated circuit die 50A. The die connectors 62 may be formed by a damascene process, such as a single damascene process.

Further, the through vias 86 are formed extending through the passivation layer(s) 58, the bonding layer(s) 66, and the dielectric layers 64 and 82. The through vias 86 are thus electrically coupled to the bottom wafer 90. The through vias 86 may be formed by a damascene process, such as a single damascene process. In some embodiments, the die connectors 62 for the top integrated circuit die 50A and the through vias 86 are formed simultaneously, e.g., in a same damascene process that uses a single mask to pattern openings for the die connectors 62 and through vias 86. In some embodiments, the die connectors 62 for the top integrated circuit die 50A and the through vias 86 are formed in different processes, e.g., in different damascene processes that use different masks to pattern openings for the die connectors 62 and through vias 86.

After forming the die connectors 62 and through vias 86, a singulation process, such as the singulation process 88 (see FIG. 13), may be performed to singulate the die stack 80. The die stack 80 can be packaged to form an integrated circuit package. The integrated circuit package electrically couples the top integrated circuit die 50A and bottom integrated circuit die 50B. For example, processing as described above may be performed to form a package similar to the integrated circuit package 100 of FIG. 15, or a package similar to the integrated circuit package 200 of FIG. 22.

Figure 29:
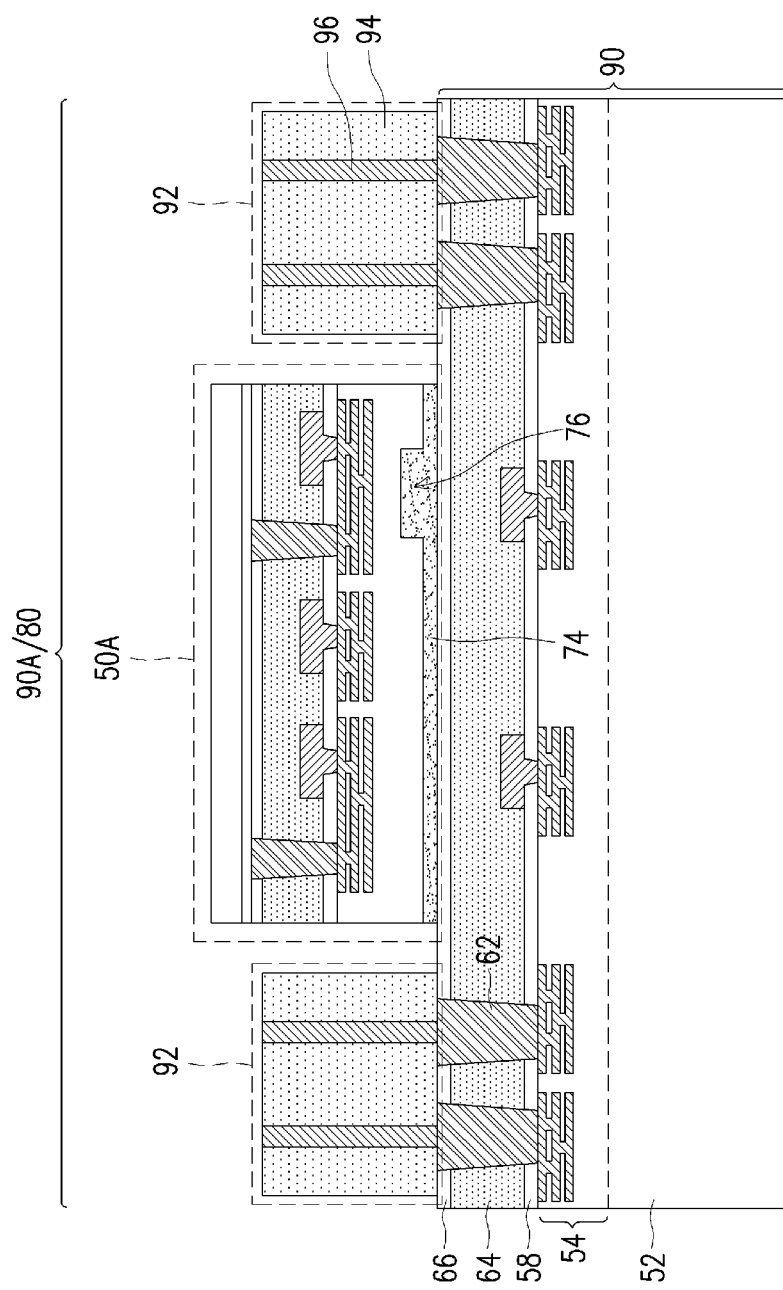
FIGS. 29 through 31 are cross-sectional views of intermediate steps during a process for forming a die stack, in accordance with other embodiments.
Figure 30:
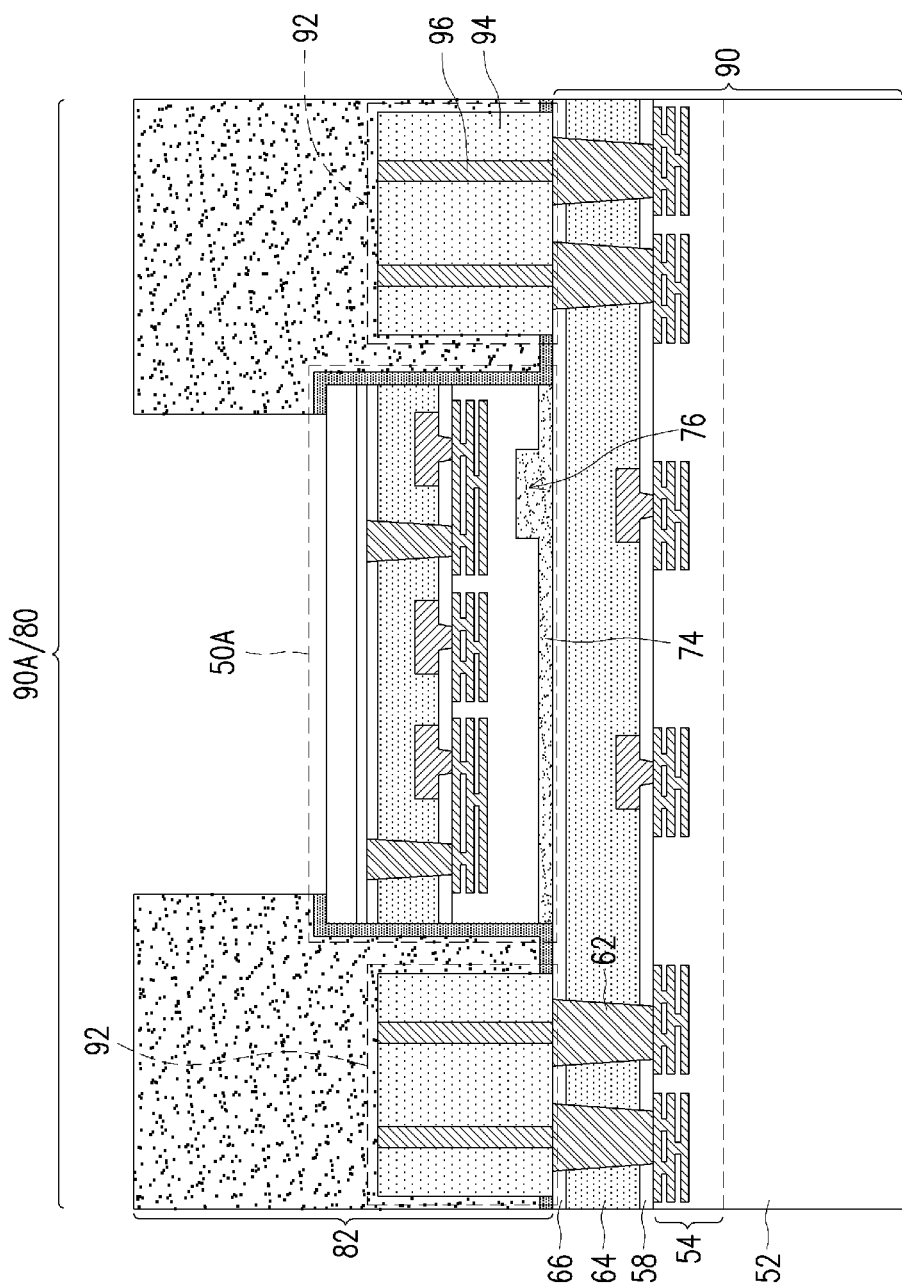
Figure 31:
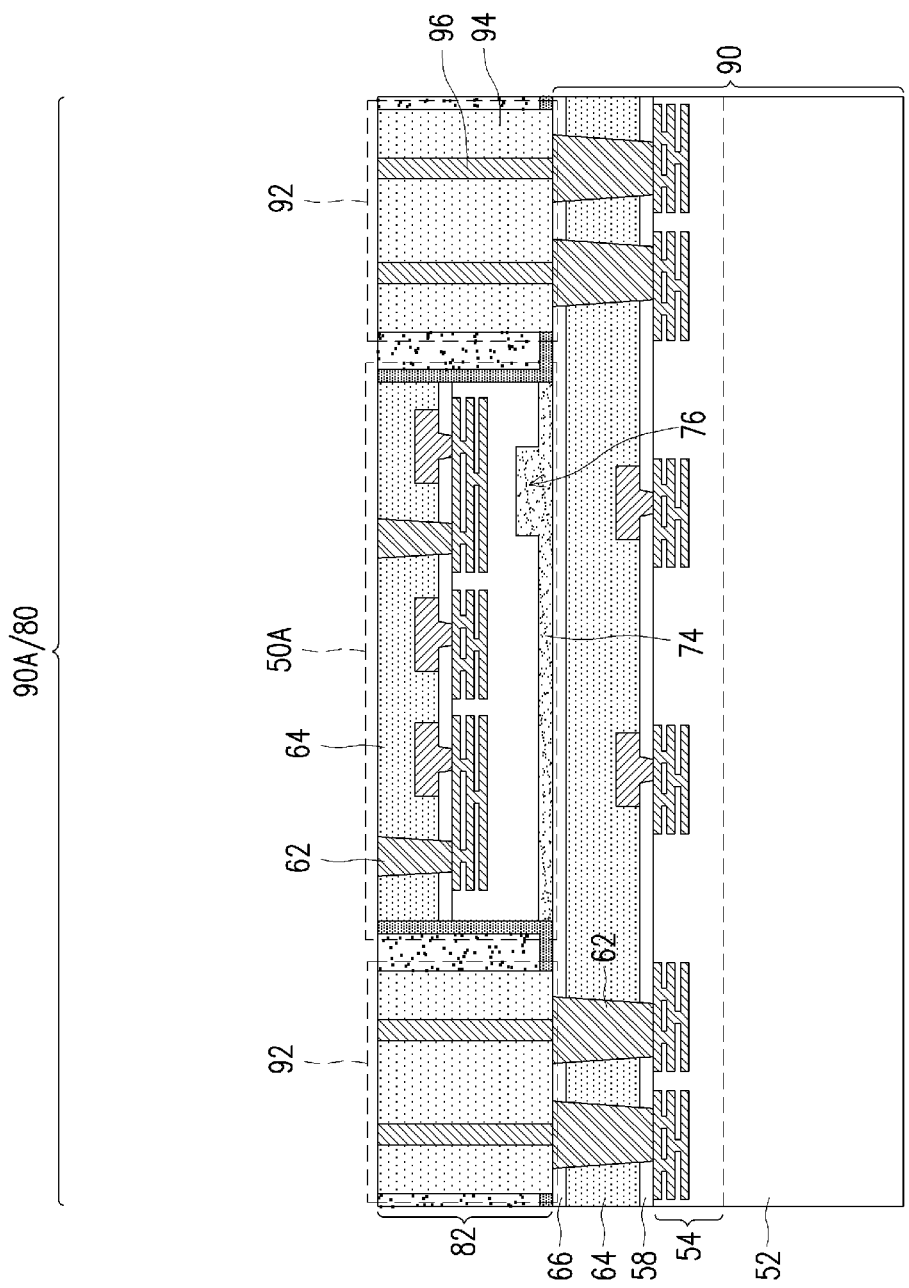

FIGS. 29 through 31 are cross-sectional views of intermediate steps during a process for forming a die stack 80, in accordance with other embodiments. FIG. 29 illustrates a die stack 80 in a similar state of processing as the intermediate structure of FIG. 9. In this embodiment, the die connectors 62 are formed during formation of both the top integrated circuit die 50A and the bottom wafer 90.

In FIG. 29, one or more via dies 92 are bonded to the first device region 90A of the bottom wafer 90, adjacent the top integrated circuit die 50A. The via dies 92 include a substrate 94 and TSVs 96. The substrate 94 may be a semiconductor substrate, such as silicon, doped or undoped, or may include other semiconductor materials, such as germanium; a compound semiconductor; or combinations thereof. In another embodiment, the substrate 94 may be formed of a dielectric material. The substrate 94 may be free from active devices and passive devices, such that the only conductive features in the via dies 92 are the TSVs 96. The TSVs 96 may include one or more layers of a conductive material. The conductive material may comprise a metal, such as copper, titanium, tungsten, aluminum, or the like. The via dies 92 are preformed dies from another manufacturing process, and may be bonded to the bonding layer(s) 66 by, e.g., fusion bonding. For example, each substrate 94 can be pressed to the bonding layer(s) 66 to form silicon-to-dielectric bonds that directly bond the substrate 94 to the bottom wafer 90. The via dies 92 can be bonded to the bottom wafer 90 before, concurrently with, or after the top integrated circuit die 50A In FIG. 30, the dielectric layer(s) 82 are formed over the bottom wafer 90, top integrated circuit die 50A, and via dies 92. The dielectric layer(s) 82 are patterned to form an opening 84 exposing the top integrated circuit die 50A, which can reduce pattern loading effects in a subsequent planarization process. The via dies 92 are not exposed by the opening 84.

In FIG. 31, a planarization process is performed to remove portions of the dielectric layer(s) 82 over the top integrated circuit die 50A and via dies 92. The planarization may be performed by an etching process, a chemical-mechanical polish (CMP), a grinding process, or the like. After the planarization, the die connectors 62 of the top integrated circuit die 50A and the TSVs 96 of the via dies 92 are exposed. Topmost surfaces of the dielectric layer(s) 82, top integrated circuit die 50A, and via dies 92 are planar after the planarization.

After exposing the top integrated circuit die 50A and via dies 92, a singulation process, such as the singulation process 88 (see FIG. 13), may be performed to singulate the die stack 80. The die stack 80 can be packaged to form an integrated circuit package. The integrated circuit package electrically couples the top integrated circuit die 50A and bottom integrated circuit die 50B. For example, processing as described above may be performed to form a package similar to the integrated circuit package 100 of FIG. 15, or a package similar to the integrated circuit package 200 of FIG. 22.

Embodiments may achieve advantages. Forming the die stacks 80 allows several types of integrated circuit dies 50, such as logic dies and memory dies, to be packaged into a same integrated circuit package. Interconnection of the integrated circuit dies 50 in a die stack 80 may be accomplished by redistribution structures in the subsequently formed integrated circuit package, particularly when the redistribution structures have fine-pitched metallization patterns, such as metallization patterns with a pitch in the range of about 0.8 μm to about 5 μm. For example, the redistribution structure 102 of the integrated circuit package 100 or the redistribution structure 214 of the integrated circuit package 200 may be used to electrically couple the integrated circuit dies 50 in a die stack 80. Interconnection of the integrated circuit dies 50 may thus be accomplished without the use of through substrate vias (TSVs) in the integrated circuit dies 50, and without the use of interposers in the integrated circuit package, thereby reducing manufacturing costs of the packages.

In an embodiment, a device includes: a bottom integrated circuit die having a first front side and a first back side; a top integrated circuit die having a second front side and a second back side, the second back side being bonded to the first front side, the top integrated circuit die being free from through substrate vias (TSVs); a dielectric layer surrounding the top integrated circuit die, the dielectric layer being disposed on the first front side, the dielectric layer and the bottom integrated circuit die being laterally coterminous; and a through via extending through the dielectric layer, the through via being electrically coupled to the bottom integrated circuit die, surfaces of the through via, the dielectric layer, and the top integrated circuit die being planar.

In some embodiments of the device, the second back side is bonded to the first front side by an adhesive. In some embodiments of the device, the top integrated circuit die includes a semiconductor substrate, and the bottom integrated circuit die includes a first bonding layer at the first front side, the semiconductor substrate being directly bonded to the first bonding layer. In some embodiments of the device, the bottom integrated circuit die includes a first bonding layer at the first front side, and the top integrated circuit die includes a second bonding layer at the second back side, the first bonding layer being directly bonded to the second bonding layer. In some embodiments of the device, the top integrated circuit die includes a semiconductor substrate and an alignment mark in the semiconductor substrate, the alignment mark and the second bonding layer being a continuous dielectric material. In some embodiments, the device further includes: a semiconductor substrate having a third front side and a third back side, the third back side being bonded to the first front side, the through via extending through the semiconductor substrate, surfaces of the dielectric layer and the semiconductor substrate being planar, the semiconductor substrate being free from active devices and passive devices. In some embodiments of the device, the bottom integrated circuit die includes: a semiconductor substrate; and an interconnect structure on the semiconductor substrate, the interconnect structure including a contact pad, the through via being physically and electrically coupled to the contact pad. In some embodiments of the device, the bottom integrated circuit die includes: a semiconductor substrate; an interconnect structure on the semiconductor substrate, the interconnect structure including a contact pad; and a die connector on the contact pad, the through via being physically and electrically coupled to the die connector. In some embodiments, the device further includes: a redistribution structure on the top integrated circuit die, the dielectric layer, and the through via, the redistribution structure including metallization patterns, the metallization patterns being physically and electrically coupled to the through via and the top integrated circuit die.

In an embodiment, a device includes: a die stack including: a bottom integrated circuit die; a top integrated circuit die on the bottom integrated circuit die, a back side of the top integrated circuit die being bonded to a front side of the bottom integrated circuit die, the bottom integrated circuit die being wider than the top integrated circuit die, the top integrated circuit die including a first die connector; a first through via adjacent the top integrated circuit die, the first through via being physically and electrically coupled to the bottom integrated circuit die; and a first dielectric layer surrounding the first through via, the first dielectric layer physically separating the first through via from the top integrated circuit die; and a redistribution structure including: a metallization pattern on the die stack, the metallization pattern including a conductive line on the first die connector, the first through via, and the first dielectric layer; and a second dielectric layer on the metallization pattern, where the die stack is free of solder.

In some embodiments of the device, the metallization pattern includes conductive features having a pitch in a range of about 0.8 μm to about 5 μm. In some embodiments, the device further includes: an encapsulant surrounding the die stack, the encapsulant and the second dielectric layer being laterally coterminous. In some embodiments, the device further includes: a second through via extending through the encapsulant, the second through via being electrically coupled to the metallization pattern. In some embodiments of the device, the first dielectric layer, the second dielectric layer, and the bottom integrated circuit die are laterally coterminous.

In an embodiment, a method includes: bonding a back side of a first integrated circuit die to a front side of a wafer; depositing a first dielectric layer on the wafer and the first integrated circuit die; planarizing the first dielectric layer such that surfaces of the first integrated circuit die and the first dielectric layer are planar; forming a conductive via extending through the first dielectric layer, the conductive via being electrically coupled to the wafer without the use of solder; and singulating the wafer and the first dielectric layer, singulated portions of the wafer forming a second integrated circuit die.

In some embodiments, the method further includes: forming the first integrated circuit die, the first integrated circuit die including a first die connector; and forming the second integrated circuit die in the wafer, the second integrated circuit die including a second die connector, the conductive via being physically and electrically coupled to the second die connector. In some embodiments, the method further includes: forming the first integrated circuit die, the first integrated circuit die including a first die connector; and forming the second integrated circuit die in the wafer, the second integrated circuit die including a contact pad and a second dielectric layer over the contact pad, the conductive via extending through the second dielectric layer, the conductive via being physically and electrically coupled to the contact pad. In some embodiments, the method further includes: forming the first integrated circuit die, the first integrated circuit die including a contact pad and a second dielectric layer over the contact pad; forming the second integrated circuit die in the wafer, the second integrated circuit die including a first die connector, the conductive via being physically and electrically coupled to the first die connector; and after the bonding, forming a second die connector extending through the second dielectric layer, the second die connector being physically and electrically coupled to the contact pad. In some embodiments, the method further includes: forming the first integrated circuit die, the first integrated circuit die including a first contact pad and a second dielectric layer over the first contact pad; and forming the second integrated circuit die in the wafer, the second integrated circuit die including a second contact pad and a third dielectric layer over the second contact pad, the conductive via extending through the third dielectric layer, the conductive via being physically and electrically coupled to the second contact pad; and after the bonding, forming a die connector extending through the second dielectric layer, the die connector being physically and electrically coupled to the first contact pad. In some embodiments, the method further includes: forming a redistribution structure on the first integrated circuit die, the first dielectric layer, and the through via, the redistribution structure including metallization patterns, the metallization patterns being physically and electrically coupled to the through via and the first integrated circuit die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a bottom integrated circuit die having a first front side and a first back side;
   a top integrated circuit die having a second front side and a second back side, the second back side being bonded to the first front side, the top integrated circuit die being free from through substrate vias (TSVs);
   a dielectric layer surrounding the top integrated circuit die, the dielectric layer being disposed on the first front side, the dielectric layer and the bottom integrated circuit die being laterally coterminous; and
   a through via extending through the dielectric layer, the through via being electrically coupled to the bottom integrated circuit die, surfaces of the through via, the dielectric layer, and the top integrated circuit die being planar.

2. The device of claim 1, wherein the second back side is bonded to the first front side by an adhesive.

3. The device of claim 1, wherein the top integrated circuit die comprises a semiconductor substrate, and the bottom integrated circuit die comprises a first bonding layer at the first front side, the semiconductor substrate being directly bonded to the first bonding layer.

4. The device of claim 1, wherein the bottom integrated circuit die comprises a first bonding layer at the first front side, and the top integrated circuit die comprises a second bonding layer at the second back side, the first bonding layer being directly bonded to the second bonding layer.

5. The device of claim 4, wherein the top integrated circuit die comprises a semiconductor substrate and an alignment mark in the semiconductor substrate, the alignment mark and the second bonding layer being a continuous dielectric material.

6. The device of claim 1 further comprising:
   a semiconductor substrate having a third front side and a third back side, the third back side being bonded to the first front side, the through via extending through the semiconductor substrate, surfaces of the dielectric layer and the semiconductor substrate being planar, the semiconductor substrate being free from active devices and from passive devices.

7. The device of claim 1 wherein the bottom integrated circuit die comprises:
   a semiconductor substrate; and
   an interconnect structure on the semiconductor substrate, the interconnect structure comprising a contact pad, the through via being physically and electrically coupled to the contact pad.

8. The device of claim 1 wherein the bottom integrated circuit die comprises:
   a semiconductor substrate;
   an interconnect structure on the semiconductor substrate, the interconnect structure comprising a contact pad; and
   a die connector on the contact pad, the through via being physically and electrically coupled to the die connector.

9. The device of claim 1 further comprising:
   a redistribution structure on the top integrated circuit die, the dielectric layer, and the through via, the redistribution structure comprising metallization patterns, the metallization patterns being physically and electrically coupled to the through via and the top integrated circuit die.

10. A device comprising:
    a die stack comprising:
      a bottom integrated circuit die;
      a top integrated circuit die on the bottom integrated circuit die, a back side of the top integrated circuit die being bonded to a front side of the bottom integrated circuit die, the bottom integrated circuit die being wider than the top integrated circuit die, the top integrated circuit die comprising a first die connector;
      a first through via adjacent the top integrated circuit die, the first through via being physically and electrically coupled to the bottom integrated circuit die; and
      a first dielectric layer surrounding the first through via, the first dielectric layer physically separating the first through via from the top integrated circuit die; and
    a redistribution structure comprising:
      a metallization pattern on the die stack, the metallization pattern electrically coupling the first die connector to the first through via; and
      a second dielectric layer on the metallization pattern and the first dielectric layer,
    wherein the die stack is free of solder.

11. The device of claim 10, wherein the metallization pattern comprises conductive features having a pitch in a range of about 0.8 µm to about 5 µm.

12. The device of claim 10 further comprising:
    an encapsulant surrounding the die stack, the encapsulant and the second dielectric layer being laterally coterminous.

13. The device of claim 12 further comprising:
a second through via extending through the encapsulant, the second through via being electrically coupled to the metallization pattern.

14. The device of claim 10, wherein the first dielectric layer, the second dielectric layer, and the bottom integrated circuit die are laterally coterminous.

15. The device of claim 10, wherein a top surface of the first dielectric layer is coplanar with a top surface of the first through via and a top surface of the first die connector, and the metallization pattern has a line portion extending along the top surface of the first dielectric layer, the top surface of the first through via, and the top surface of the first die connector.

16. A device comprising:
a first integrated circuit die;
a second integrated circuit die bonded to the first integrated circuit die in a back-to-face manner;
a dielectric layer around the second integrated circuit die, the dielectric layer and the first integrated circuit die being laterally coterminous; and
a conductive via extending through the dielectric layer, the conductive via connected to the first integrated circuit die, a top surface of the conductive via coplanar with a top surface of the dielectric layer and a top surface of the second integrated circuit die.

17. The device of claim 16, wherein the second integrated circuit die is free from through substrate vias (TSVs).

18. The device of claim 16, wherein the second integrated circuit die is bonded to the first integrated circuit die with dielectric-to-dielectric bonds that are free of solder.

19. The device of claim 16 further comprising:
a redistribution structure on the dielectric layer and the second integrated circuit die, the redistribution structure comprising redistribution lines connected to the conductive via and the second integrated circuit die, the redistribution lines having a pitch in a range of about 0.8 µm to about 5 µm.

20. The device of claim 19 further comprising:
an encapsulant around the first integrated circuit die and the dielectric layer, the redistribution structure disposed on the encapsulant.

* * * * *